(12) United States Patent
Lung

(10) Patent No.: US 8,173,987 B2
(45) Date of Patent: May 8, 2012

(54) INTEGRATED CIRCUIT 3D PHASE CHANGE MEMORY ARRAY AND MANUFACTURING METHOD

(75) Inventor: Hsiang-Lan Lung, Elmsford, NY (US)

(73) Assignee: Macronix International Co., Ltd., Hsinchu (TW)

( * ) Notice: Subject to any disclaimer, the term of this patent is extended or adjusted under 35 U.S.C. 154(b) by 53 days.

(21) Appl. No.: 12/430,386

(22) Filed: Apr. 27, 2009

(65) Prior Publication Data

US 2010/0270529 A1   Oct. 28, 2010

(51) Int. Cl.
*H01L 29/02* (2006.01)
(52) U.S. Cl. .. 257/2; 257/3; 257/4; 257/5; 257/E29.002; 438/102; 438/103
(58) Field of Classification Search .................. 257/1–5, 257/E29.002; 438/102–103; 365/163
See application file for complete search history.

(56) References Cited

U.S. PATENT DOCUMENTS

| | | |
|---|---|---|
| 3,271,591 A | 9/1966 | Ovshinsky |
| 3,530,441 A | 9/1970 | Ovshinsky |
| 4,452,592 A | 6/1984 | Tsai |
| 4,599,705 A | 7/1986 | Holmberg et al. |
| 4,719,594 A | 1/1988 | Young et al. |
| 4,769,339 A | 9/1988 | Ishii |
| 4,876,220 A | 10/1989 | Mohsen et al. |
| 4,959,812 A | 9/1990 | Momodomi et al. |
| 5,106,775 A | 4/1992 | Kaga et al. |
| 5,166,096 A | 11/1992 | Cote et al. |
| 5,166,758 A | 11/1992 | Ovshinsky et al. |
| 5,177,567 A | 1/1993 | Klersy et al. |
| 5,332,923 A | 7/1994 | Takeuchi et al. |
| 5,391,901 A | 2/1995 | Tanabe et al. |
| 5,515,488 A | 5/1996 | Hoppe et al. |
| 5,534,712 A | 7/1996 | Ovshinsky et al. |
| 5,550,396 A | 8/1996 | Tsutsumi et al. |
| 5,687,112 A | 11/1997 | Ovshinsky |
| 5,688,713 A | 11/1997 | Linliu et al. |
| 5,716,883 A | 2/1998 | Tseng et al. |
| 5,754,472 A | 5/1998 | Sim et al. |
| 5,789,277 A | 8/1998 | Zahorik et al. |
| 5,789,758 A | 8/1998 | Reinberg |
| 5,814,527 A | 9/1998 | Wolstenholme et al. |
| 5,831,276 A | 11/1998 | Gonzalez et al. |

(Continued)

FOREIGN PATENT DOCUMENTS

EP   1936681 A1   6/2008

(Continued)

OTHER PUBLICATIONS

"Magnetic Bit Boost," www.sciencenews.org, Dec. 18 & 25, 2004, p. 389, vol. 166.

(Continued)

*Primary Examiner* — Jami M Valentine
(74) *Attorney, Agent, or Firm* — Haynes Beffel & Wolfeld LLP

(57) ABSTRACT

A 3D phase change memory device is based on an array of electrode pillars and a plurality of electrode planes that intersect the electrode pillars at interface regions that include memory elements that comprise a programmable phase change memory element and a threshold switching element. The electrode pillars can be selected using two-dimensional decoding, and the plurality of electrode planes can be selected using decoding on a third dimension.

12 Claims, 13 Drawing Sheets

U.S. PATENT DOCUMENTS

| | | |
|---|---|---|
| 5,837,564 A | 11/1998 | Sandhu et al. |
| 5,869,843 A | 2/1999 | Harshfield |
| 5,879,955 A | 3/1999 | Gonzalez et al. |
| 5,902,704 A | 5/1999 | Schoenborn et al. |
| 5,920,788 A | 7/1999 | Reinberg |
| 5,933,365 A | 8/1999 | Klersy et al. |
| 5,952,671 A | 9/1999 | Reinberg et al. |
| 5,958,358 A | 9/1999 | Tenne et al. |
| 5,970,336 A | 10/1999 | Wolstenholme et al. |
| 5,985,698 A | 11/1999 | Gonzalez et al. |
| 5,998,244 A | 12/1999 | Wolstenholme et al. |
| 6,011,725 A | 1/2000 | Eitan et al. |
| 6,025,220 A | 2/2000 | Sandhu |
| 6,031,287 A | 2/2000 | Harshfield |
| 6,034,882 A | 3/2000 | Johnson et al. |
| 6,046,951 A | 4/2000 | El Hajji et al. |
| 6,066,870 A | 5/2000 | Siek |
| 6,075,719 A | 6/2000 | Lowrey et al. |
| 6,077,674 A | 6/2000 | Schleifer et al. |
| 6,077,729 A | 6/2000 | Harshfield |
| 6,087,269 A | 7/2000 | Williams |
| 6,087,674 A | 7/2000 | Ovshinsky et al. |
| 6,104,038 A | 8/2000 | Gonzalez et al. |
| 6,111,264 A | 8/2000 | Wolstenholme et al. |
| 6,114,713 A | 9/2000 | Zahorik |
| 6,117,720 A | 9/2000 | Harshfield |
| 6,147,395 A | 11/2000 | Gilgen |
| 6,150,253 A | 11/2000 | Doan et al. |
| 6,153,890 A | 11/2000 | Wolstenholme et al. |
| 6,177,317 B1 | 1/2001 | Huang et al. |
| 6,185,122 B1 | 2/2001 | Johnson et al. |
| 6,189,582 B1 | 2/2001 | Reinberg et al. |
| 6,236,059 B1 | 5/2001 | Wolstenholme et al. |
| RE37,259 E | 7/2001 | Ovshinsky |
| 6,271,090 B1 | 8/2001 | Huang et al. |
| 6,280,684 B1 | 8/2001 | Yamada et al. |
| 6,287,887 B1 | 9/2001 | Gilgen |
| 6,291,137 B1 | 9/2001 | Lyons et al. |
| 6,314,014 B1 | 11/2001 | Lowrey et al. |
| 6,316,348 B1 | 11/2001 | Fu et al. |
| 6,320,786 B1 | 11/2001 | Chang et al. |
| 6,326,307 B1 | 12/2001 | Lindley et al. |
| 6,337,266 B1 | 1/2002 | Zahorik |
| 6,339,544 B1 | 1/2002 | Chiang et al. |
| 6,351,406 B1 | 2/2002 | Johnson et al. |
| 6,372,651 B1 | 4/2002 | Yang et al. |
| 6,380,068 B2 | 4/2002 | Jeng et al. |
| 6,420,215 B1 | 7/2002 | Knall et al. |
| 6,420,216 B1 | 7/2002 | Clevenger et al. |
| 6,420,725 B1 | 7/2002 | Harshfield |
| 6,423,621 B2 | 7/2002 | Doan et al. |
| 6,429,064 B1 | 8/2002 | Wicker |
| 6,440,837 B1 | 8/2002 | Harshfield |
| 6,462,353 B1 | 10/2002 | Gilgen |
| 6,483,736 B2 | 11/2002 | Johnson et al. |
| 6,487,106 B1 | 11/2002 | Kozicki |
| 6,487,114 B2 | 11/2002 | Jong et al. |
| 6,501,111 B1 | 12/2002 | Lowrey |
| 6,511,867 B2 | 1/2003 | Lowrey et al. |
| 6,512,241 B1 | 1/2003 | Lai |
| 6,512,263 B1 | 1/2003 | Yuan et al. |
| 6,514,788 B2 | 2/2003 | Quinn |
| 6,514,820 B2 | 2/2003 | Ahn et al. |
| 6,534,781 B2 | 3/2003 | Dennison |
| 6,545,903 B1 | 4/2003 | Wu |
| 6,551,866 B1 | 4/2003 | Maeda et al. |
| 6,555,860 B2 | 4/2003 | Lowrey et al. |
| 6,563,156 B2 | 5/2003 | Harshfield |
| 6,566,700 B2 | 5/2003 | Xu |
| 6,567,293 B1 | 5/2003 | Lowrey et al. |
| 6,576,546 B2 | 6/2003 | Gilbert et al. |
| 6,579,760 B1 | 6/2003 | Lung et al. |
| 6,586,761 B2 | 7/2003 | Lowrey |
| 6,589,714 B2 | 7/2003 | Maimon et al. |
| 6,593,176 B2 | 7/2003 | Dennison |
| 6,596,589 B2 | 7/2003 | Tseng et al. |
| 6,597,009 B2 | 7/2003 | Wicker |
| 6,605,527 B2 | 8/2003 | Dennison et al. |
| 6,605,821 B1 | 8/2003 | Lee et al. |
| 6,607,974 B2 | 8/2003 | Harshfield |
| 6,613,604 B2 | 9/2003 | Maimon et al. |
| 6,617,192 B1 | 9/2003 | Lowrey et al. |
| 6,621,095 B2 | 9/2003 | Chiang et al. |
| 6,627,530 B2 | 9/2003 | Li et al. |
| 6,639,849 B2 | 10/2003 | Takahashi et al. |
| 6,673,700 B2 | 1/2004 | Dennison et al. |
| 6,674,115 B2 | 1/2004 | Hudgens et al. |
| 6,677,678 B2 | 1/2004 | Biolsi et al. |
| 6,744,088 B1 | 6/2004 | Dennison |
| 6,750,079 B2 | 6/2004 | Lowrey et al. |
| 6,750,101 B2 | 6/2004 | Lung et al. |
| 6,791,102 B2 | 9/2004 | Johnson et al. |
| 6,797,979 B2 | 9/2004 | Chiang et al. |
| 6,800,504 B2 | 10/2004 | Li et al. |
| 6,800,563 B2 | 10/2004 | Xu |
| 6,815,704 B1 | 11/2004 | Chen |
| 6,838,692 B1 | 1/2005 | Lung et al. |
| 6,850,432 B2 | 2/2005 | Lu et al. |
| 6,859,389 B2 | 2/2005 | Idehara |
| 6,861,267 B2 | 3/2005 | Xu et al. |
| 6,864,500 B2 | 3/2005 | Gilton |
| 6,864,503 B2 | 3/2005 | Lung et al. |
| 6,867,638 B2 | 3/2005 | Saiki et al. |
| 6,881,603 B2 | 4/2005 | Lai |
| 6,888,750 B2 | 5/2005 | Walker et al. |
| 6,894,304 B2 | 5/2005 | Moore |
| 6,894,305 B2 | 5/2005 | Yi et al. |
| 6,900,517 B2 | 5/2005 | Tanaka et al. |
| 6,903,362 B2 | 6/2005 | Wyeth et al. |
| 6,909,107 B2 | 6/2005 | Rodgers et al. |
| 6,910,907 B2 | 6/2005 | Layadi et al. |
| 6,927,410 B2 | 8/2005 | Chen |
| 6,928,022 B2 | 8/2005 | Cho et al. |
| 6,933,516 B2 | 8/2005 | Xu |
| 6,936,544 B2 | 8/2005 | Huang et al. |
| 6,936,840 B2 | 8/2005 | Sun et al. |
| 6,937,507 B2 | 8/2005 | Chen |
| 6,943,365 B2 | 9/2005 | Lowrey et al. |
| 6,969,866 B1 | 11/2005 | Lowrey et al. |
| 6,972,428 B2 | 12/2005 | Maimon |
| 6,972,430 B2 | 12/2005 | Casagrande et al. |
| 6,977,181 B1 | 12/2005 | Raberg et al. |
| 6,992,932 B2 | 1/2006 | Cohen et al. |
| 7,023,009 B2 | 4/2006 | Kostylev et al. |
| 7,033,856 B2 | 4/2006 | Lung et al. |
| 7,038,230 B2 | 5/2006 | Chen et al. |
| 7,038,938 B2 | 5/2006 | Kang et al. |
| 7,042,001 B2 | 5/2006 | Kim et al. |
| 7,054,183 B2 | 5/2006 | Rinerson et al. |
| 7,067,837 B2 | 6/2006 | Hwang et al. |
| 7,067,864 B2 | 6/2006 | Nishida et al. |
| 7,067,865 B2 | 6/2006 | Lung et al. |
| 7,078,273 B2 | 7/2006 | Matsuoka et al. |
| 7,099,180 B1 | 8/2006 | Dodge et al. |
| 7,115,927 B2 | 10/2006 | Hideki et al. |
| 7,122,281 B2 | 10/2006 | Pierrat |
| 7,122,824 B2 | 10/2006 | Khouri et al. |
| 7,126,149 B2 | 10/2006 | Iwasaki et al. |
| 7,126,847 B2 | 10/2006 | Ha et al. |
| 7,132,675 B2 | 11/2006 | Gilton |
| 7,151,273 B2 | 12/2006 | Campbell et al. |
| 7,154,774 B2 | 12/2006 | Bedeschi et al. |
| 7,158,411 B2 | 1/2007 | Yeh et al. |
| 7,164,147 B2 | 1/2007 | Lee et al. |
| 7,166,533 B2 | 1/2007 | Happ |
| 7,169,635 B2 | 1/2007 | Kozicki |
| 7,177,169 B2 | 2/2007 | Scheuerlein |
| 7,202,493 B2 | 4/2007 | Lung et al. |
| 7,208,751 B2 | 4/2007 | Ooishi et al. |
| 7,214,958 B2 | 5/2007 | Happ |
| 7,220,983 B2 | 5/2007 | Lung |
| 7,229,883 B2 | 6/2007 | Wang et al. |
| 7,238,959 B2 | 7/2007 | Chen |
| 7,238,994 B2 | 7/2007 | Chen et al. |
| 7,248,494 B2 | 7/2007 | Oh et al. |
| 7,251,157 B2 | 7/2007 | Osada et al. |
| 7,253,429 B2 | 8/2007 | Klersy et al. |

| | | |
|---|---|---|
| 7,254,059 B2 | 8/2007 | Li et al. |
| 7,269,052 B2 | 9/2007 | Segal et al. |
| 7,277,317 B2 | 10/2007 | Le Phan et al. |
| 7,291,556 B2 | 11/2007 | Choi et al. |
| 7,309,630 B2 | 12/2007 | Fan et al. |
| 7,321,130 B2 | 1/2008 | Lung et al. |
| 7,323,708 B2 | 1/2008 | Lee et al. |
| 7,323,734 B2 | 1/2008 | Ha et al. |
| 7,332,370 B2 | 2/2008 | Chang et al. |
| 7,336,526 B2 | 2/2008 | Osada et al. |
| 7,351,648 B2 | 4/2008 | Furukawa et al. |
| 7,359,231 B2 | 4/2008 | Venkataraman et al. |
| 7,364,935 B2 | 4/2008 | Lung et al. |
| 7,365,385 B2 | 4/2008 | Abbott |
| 7,379,328 B2 | 5/2008 | Osada et al. |
| 7,382,647 B1 | 6/2008 | Gopalakrishnan |
| 7,385,235 B2 | 6/2008 | Lung et al. |
| 7,388,273 B2 | 6/2008 | Burr et al. |
| 7,394,088 B2 | 7/2008 | Lung |
| 7,397,060 B2 | 7/2008 | Lung |
| 7,400,522 B2 | 7/2008 | Toda et al. |
| 7,420,242 B2 | 9/2008 | Lung |
| 7,423,300 B2 | 9/2008 | Lung et al. |
| 7,426,134 B2 | 9/2008 | Happ et al. |
| 7,440,308 B2 | 10/2008 | Jeong et al. |
| 7,449,710 B2 | 11/2008 | Lung |
| 7,473,576 B2 | 1/2009 | Lung |
| 7,479,649 B2 | 1/2009 | Lung |
| 7,485,891 B2 | 2/2009 | Hamann et al. |
| 7,486,534 B2 | 2/2009 | Chen et al. |
| 7,502,252 B2 | 3/2009 | Fuji et al. |
| 7,507,986 B2 | 3/2009 | Lung |
| 7,514,334 B2 | 4/2009 | Chen et al. |
| 7,514,705 B2 | 4/2009 | Breitwisch et al. |
| 7,515,461 B2 | 4/2009 | Happ et al. |
| 2002/0070457 A1 | 6/2002 | Sun et al. |
| 2002/0113273 A1 | 8/2002 | Hwang et al. |
| 2003/0072195 A1 | 4/2003 | Mikolajick |
| 2003/0095426 A1 | 5/2003 | Hush et al. |
| 2003/0186481 A1 | 10/2003 | Lung |
| 2004/0026686 A1 | 2/2004 | Lung |
| 2004/0051094 A1 | 3/2004 | Ooishi |
| 2004/0113137 A1 | 6/2004 | Lowrey |
| 2004/0165422 A1 | 8/2004 | Hideki et al. |
| 2004/0248339 A1 | 12/2004 | Lung |
| 2004/0256610 A1 | 12/2004 | Lung |
| 2005/0018526 A1 | 1/2005 | Lee |
| 2005/0029502 A1 | 2/2005 | Hudgens |
| 2005/0052904 A1 | 3/2005 | Cho et al. |
| 2005/0062087 A1 | 3/2005 | Chen et al. |
| 2005/0093022 A1 | 5/2005 | Lung |
| 2005/0127347 A1 | 6/2005 | Choi et al. |
| 2005/0127349 A1 | 6/2005 | Horak et al. |
| 2005/0141261 A1 | 6/2005 | Ahn |
| 2005/0145984 A1 | 7/2005 | Chen et al. |
| 2005/0167656 A1 | 8/2005 | Sun et al. |
| 2005/0191804 A1 | 9/2005 | Lai et al. |
| 2005/0195633 A1 | 9/2005 | Choi et al. |
| 2005/0201182 A1 | 9/2005 | Osada et al. |
| 2005/0212024 A1 | 9/2005 | Happ |
| 2005/0212026 A1 | 9/2005 | Chung et al. |
| 2005/0215009 A1 | 9/2005 | Cho |
| 2005/0263829 A1 | 12/2005 | Song et al. |
| 2006/0006472 A1 | 1/2006 | Jiang |
| 2006/0038221 A1 | 2/2006 | Lee et al. |
| 2006/0066156 A1 | 3/2006 | Dong et al. |
| 2006/0073642 A1 | 4/2006 | Yeh et al. |
| 2006/0091476 A1 | 5/2006 | Pinnow et al. |
| 2006/0094154 A1 | 5/2006 | Lung |
| 2006/0108667 A1 | 5/2006 | Lung |
| 2006/0110878 A1 | 5/2006 | Lung et al. |
| 2006/0110888 A1 | 5/2006 | Cho et al. |
| 2006/0113520 A1 | 6/2006 | Yamamoto et al. |
| 2006/0113521 A1 | 6/2006 | Lung |
| 2006/0118913 A1 | 6/2006 | Yi et al. |
| 2006/0124916 A1 | 6/2006 | Lung |
| 2006/0126395 A1 | 6/2006 | Chen et al. |
| 2006/0131555 A1 | 6/2006 | Liu et al. |
| 2006/0138467 A1 | 6/2006 | Lung |
| 2006/0154185 A1 | 7/2006 | Ho et al. |
| 2006/0157680 A1 | 7/2006 | Takaura et al. |
| 2006/0157681 A1 | 7/2006 | Chen et al. |
| 2006/0163554 A1 | 7/2006 | Lankhorst et al. |
| 2006/0172067 A1 | 8/2006 | Ovshinsky et al. |
| 2006/0175599 A1 | 8/2006 | Happ |
| 2006/0198183 A1 | 9/2006 | Kawahara et al. |
| 2006/0205108 A1 | 9/2006 | Maimon et al. |
| 2006/0211165 A1 | 9/2006 | Hwang et al. |
| 2006/0226409 A1 | 10/2006 | Burr et al. |
| 2006/0234138 A1 | 10/2006 | Fehlhaber et al. |
| 2006/0237756 A1 | 10/2006 | Park et al. |
| 2006/0245236 A1 | 11/2006 | Zaidi |
| 2006/0250885 A1 | 11/2006 | Cho et al. |
| 2006/0261392 A1 | 11/2006 | Lee et al. |
| 2006/0266993 A1 | 11/2006 | Suh et al. |
| 2006/0284157 A1 | 12/2006 | Chen et al. |
| 2006/0284158 A1 | 12/2006 | Lung et al. |
| 2006/0284214 A1 | 12/2006 | Chen |
| 2006/0284279 A1 | 12/2006 | Lung et al. |
| 2006/0286709 A1 | 12/2006 | Lung et al. |
| 2006/0286743 A1 | 12/2006 | Lung et al. |
| 2006/0289847 A1 | 12/2006 | Dodge |
| 2006/0289848 A1 | 12/2006 | Dennison |
| 2007/0007613 A1 | 1/2007 | Wang et al. |
| 2007/0008786 A1 | 1/2007 | Scheuerlein |
| 2007/0030721 A1 | 2/2007 | Segal et al. |
| 2007/0037101 A1 | 2/2007 | Morioka |
| 2007/0040159 A1 | 2/2007 | Wang |
| 2007/0045606 A1 | 3/2007 | Magistretti et al. |
| 2007/0051936 A1 | 3/2007 | Pellizzer et al. |
| 2007/0096162 A1 | 5/2007 | Happ et al. |
| 2007/0096248 A1 | 5/2007 | Philipp et al. |
| 2007/0108077 A1 | 5/2007 | Lung et al. |
| 2007/0108429 A1 | 5/2007 | Lung |
| 2007/0108430 A1 | 5/2007 | Lung |
| 2007/0108431 A1 | 5/2007 | Chen et al. |
| 2007/0109836 A1 | 5/2007 | Lung |
| 2007/0109843 A1 | 5/2007 | Lung et al. |
| 2007/0111429 A1 | 5/2007 | Lung |
| 2007/0114508 A1* | 5/2007 | Herner et al. ............ 257/2 |
| 2007/0115794 A1 | 5/2007 | Lung |
| 2007/0117315 A1 | 5/2007 | Lai et al. |
| 2007/0120104 A1 | 5/2007 | Ahn et al. |
| 2007/0121363 A1 | 5/2007 | Lung |
| 2007/0121374 A1 | 5/2007 | Lung et al. |
| 2007/0126040 A1 | 6/2007 | Lung |
| 2007/0131922 A1 | 6/2007 | Lung |
| 2007/0138458 A1 | 6/2007 | Lung |
| 2007/0147105 A1 | 6/2007 | Lung et al. |
| 2007/0153563 A1 | 7/2007 | Nirschl |
| 2007/0154847 A1 | 7/2007 | Chen et al. |
| 2007/0155172 A1 | 7/2007 | Lai et al. |
| 2007/0156949 A1 | 7/2007 | Rudelic et al. |
| 2007/0158632 A1 | 7/2007 | Ho |
| 2007/0158633 A1 | 7/2007 | Lai et al. |
| 2007/0158645 A1 | 7/2007 | Lung |
| 2007/0158690 A1 | 7/2007 | Ho et al. |
| 2007/0158862 A1 | 7/2007 | Lung |
| 2007/0161186 A1 | 7/2007 | Ho |
| 2007/0170881 A1 | 7/2007 | Noh et al. |
| 2007/0173019 A1 | 7/2007 | Ho et al. |
| 2007/0173063 A1 | 7/2007 | Lung |
| 2007/0176261 A1 | 8/2007 | Lung |
| 2007/0187664 A1 | 8/2007 | Happ |
| 2007/0201267 A1 | 8/2007 | Happ et al. |
| 2007/0215852 A1* | 9/2007 | Lung ......................... 257/4 |
| 2007/0224726 A1 | 9/2007 | Chen et al. |
| 2007/0235811 A1 | 10/2007 | Furukawa et al. |
| 2007/0236989 A1 | 10/2007 | Lung |
| 2007/0246699 A1 | 10/2007 | Lung |
| 2007/0249090 A1 | 10/2007 | Philipp et al. |
| 2007/0252127 A1 | 11/2007 | Arnold et al. |
| 2007/0257300 A1 | 11/2007 | Ho et al. |
| 2007/0262388 A1 | 11/2007 | Ho et al. |
| 2007/0267618 A1 | 11/2007 | Zaidi et al. |
| 2007/0274121 A1 | 11/2007 | Lung et al. |
| 2007/0285960 A1 | 12/2007 | Lung et al. |
| 2007/0298535 A1 | 12/2007 | Lung |

| | | | |
|---|---|---|---|
| 2008/0006811 | A1 | 1/2008 | Philipp et al. |
| 2008/0012000 | A1 | 1/2008 | Harshfield |
| 2008/0014676 | A1 | 1/2008 | Lung et al. |
| 2008/0025089 | A1 | 1/2008 | Scheuerlein et al. |
| 2008/0043520 | A1 | 2/2008 | Chen |
| 2008/0094871 | A1 | 4/2008 | Parkinson |
| 2008/0101109 | A1 | 5/2008 | Haring-Bolivar et al. |
| 2008/0101110 | A1 | 5/2008 | Happ et al. |
| 2008/0137400 | A1 | 6/2008 | Chen et al. |
| 2008/0138929 | A1 | 6/2008 | Lung |
| 2008/0138930 | A1 | 6/2008 | Lung |
| 2008/0138931 | A1 | 6/2008 | Lung |
| 2008/0164453 | A1 | 7/2008 | Breitwisch et al. |
| 2008/0165569 | A1 | 7/2008 | Chen et al. |
| 2008/0165570 | A1 | 7/2008 | Happ et al. |
| 2008/0165572 | A1 | 7/2008 | Lung |
| 2008/0166875 | A1 | 7/2008 | Lung |
| 2008/0179582 | A1 | 7/2008 | Burr et al. |
| 2008/0180990 | A1 | 7/2008 | Lung |
| 2008/0186755 | A1 | 8/2008 | Lung et al. |
| 2008/0191187 | A1 | 8/2008 | Lung et al. |
| 2008/0192534 | A1 | 8/2008 | Lung |
| 2008/0197334 | A1 | 8/2008 | Lung |
| 2008/0224119 | A1 | 9/2008 | Burr et al. |
| 2008/0225489 | A1 | 9/2008 | Cai et al. |
| 2008/0265234 | A1 | 10/2008 | Breitwisch et al. |
| 2008/0303014 | A1 | 12/2008 | Goux et al. |
| 2009/0001341 | A1 | 1/2009 | Breitwisch et al. |
| 2009/0014704 | A1 | 1/2009 | Chen et al. |
| 2009/0023242 | A1 | 1/2009 | Lung |
| 2009/0027950 | A1 | 1/2009 | Lam et al. |
| 2009/0042335 | A1 | 2/2009 | Lung |
| 2009/0057641 | A1 | 3/2009 | Lung |
| 2009/0097321 | A1 | 4/2009 | Kim et al. |
| 2009/0098678 | A1 | 4/2009 | Lung |
| 2009/0166603 | A1 | 7/2009 | Lung |
| 2009/0184360 | A1 | 7/2009 | Jin et al. |

FOREIGN PATENT DOCUMENTS

EP          2048709 A2    4/2009

OTHER PUBLICATIONS

"New Memories Tap Spin, Gird for Battle," Science News, Apr. 3, 1999, p. 223, vol. 155.
"Optimized Thermal Capacitance in a Phase Change Memory Cell Design," IPCOM000141986D, IP.com Prior Art Database, Oct. 18, 2006, 4pp.
"Remembering on the Cheap," www.sciencenews.org, Mar. 19, 2005, p. 189, vol. 167.
"Thermal Conductivity of Crystalline Dielectrics" in CRC Handbook of Chemistry and Physics, Internet Version 2007, (87th edition), David R. Lide, ed. Taylor and Francis, Boca Raton, Fl, 2pp.
Adler, D. et al., "Threshold Switching in Chalcogenide-Glass Thin Films," J. Appl/Phys 51(6), Jun. 1980, pp. 3289-3309.
Adler, David, "Amorphous-Semiconductor Devices," Sci. Amer., vol. 236, pp. 36-48, May 1977.
Ahn, S. J. et al., "A Highly Manufacturable High Density Phase Change Memory of 64 Mb and Beyond," IEEE IEDM 2004, pp. 907-910.
Ahn, S. J. et al., "Highly Reliable 5nm Contact Cell Technology for 256Mb PRAM," VLSI Technology, Digest of Technical Papers, Jun. 14-16, 2005, pp. 98-99.
Atwood, G, et al., "90 nm Phase Change Technology with u Trench and Lance Cell Elements," VLSI Technology, Systems and Applications, Apr. 23-25, 2007, pp. 1-2.
Axon Technologies Corporation paper: Technology Description, published in 1997, pp. 1-6.
Bedeschi, F. et al., "4-MB MOSFET-Selected Phase-Change Memory Experimental Chip," IEEE, 2004, 4 pp.
Blake thesis, "Investigation of GeTeSb5 Chalcogenide Films for Use as an Analog Memory," AFIT/GE/ENG/00M-04, Mar. 2000, 121 pages.
Chao, Der-Sheng, et al., "Low Programming Current Phase Change Memory Cell with Double GST Thermally Confined Structure," Int'l Symp on VLSI Technology, Systems and Applications, Apr. 23-25, 2007, pp. 1-2.

Chen, An et al., "Non-Volatile Resistive Switching for Advanced Memory Applications," IEEE IEDM, Dec. 5-7, 2005, 4 pp.
Cho, S. L. et al., "Highly Scalable On-axis Confined Cell Structure for High Density PRAM beyond 256Mb, " 2005 Symposium on VLSI Technology Digest of Technical Papers, pp. 96-97.
Gibson, G. A. et al., "Phase-change Recording Medium that Enables Ultrahigh-density Electron-beam Data Storage, " Applied Physics Letter, 2005, 3 pp., vol. 86.
Gill, Manzur et al., "A High-Performance Nonvolatile Memory Technology for Stand-Alone Memory and Embedded Applications," 2002 IEEE-ISSCC Technical Digest (TD 12.4), 7 pp.
Gleixner, "Phase Change Memory Reliability", 22nd NVSMW, Aug. 26, 2007, 46 pages.
Ha, Y. H. et al., "An Edge Contact Type Cell for Phase Change RAM Featuring Very Low Power Consumption," 2003 Symposium on VLSI Technology Digest of Technical Papers, pp. 175-176.
Hanzawa, Satoru, et al., "A 512kB Embedded Phase Change Memory with 416kB/s Write Throughput at 100 µA Cell Write Current," ISSCC 2007, Session 26, Non-Volatile Memories/26.2, 3 pages.
Happ, T. D. et al., "Novel None-Mask Self-Heating Pillar Phase Change Memory," 2006 Symposium on VLSI Technology, 2 pp.
Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4pp.
Horii, H. et al., "A Novel Cell Technology Using N-doped GeSbTe Films for Phase Change RAM," 2003 Symposium on VLSI Technology Digest of Technical Papers, pp. 177-178.
Hudgens, S. et al., "Overview of Phase-Change Chalcogenide Nonvolatile Memory Technology," MRS Bulletin, Nov. 2004, pp. 829-832.
Hwang, Y. N. et al., "Full Integration and Reliability Evaluation of Phase-change RAM Based on 0.24um-CMOS Technologies," 2003 Symposium on VLSI Technology Digest of Technical Papers, pp. 173-174.
Iwasaki, Hiroko et al., "Completely Erasable Phase Change Optical Disk," Jpn. J. Appl. Phys., Feb. 1992, pp. 461-465, vol. 31.
Jeong, C. W. et al., "Switching Current Scaling and Reliability Evaluation in PRAM," IEEE Non-Volatile Semiconductor Memory Workshop, Monterey, CA 2004, pp. 28-29 and workshop cover sheet.
Johnson, Mark, et al., "512-Mb PROM With a Three-Dimensional Array of Diode/Antifuse Memory Cells," IEEE Journal of Solid-State Circuits, vol. 38, No. 11, Nov. 2003, 9 pages.
Jung, Soon-Moon, et al., "Three Dimensionally Stacked NAND Flash Memory Technology Using Stacking Single Crystal Si Layers on ILD and TANOS Structure for Beyond 30nm Node," IEEE IEDM 2006, Dec. 11-13, 2006, pp. 1-4.
Kim, Kinam et al., "Reliability Investigations for Manufacturable High Density PRAM," IEEE 43rd Annual International Reliability Physics Symposium, San Jose, 2005, pp. 157-162.
Kojima, Rie et al., "Ge—Sn—Sb—Te Phase-change Recording Material Having High Crystallization Speed," Proceedings of PCOS 2000, pp. 36-41.
Lacita, A. L., "Electrothermal and Phase-change Dynamics in Chalcogenide-based Memories," IEEE IEDM 2004, 4 pp.
Lai, Erh-Kun, et al., "A Multi-Layer Stackable Thin-Film Transistor (TFT) NAND-Type Flash Memory," IEEE IEDM 2006, Dec. 11-13, 2006, pp. 1-4.
Lai, Stefan, "Current Status of the Phase Change Memory and Its Future," IEEE IEDM 2003, pp. 255-258.
Lai, Stephan et al., "OUM—A 180 nm Nonvolatile Memory Cell Element Technology for Stand Alone and Embedded Applications," IEEE IEDM 2001, pp. 803-806.
Lankhorst, Martijn H.R., et al; Low-Cost and Nanoscale Non-Volatile Memory Concept for Future Silicon Chips, Mar. 13, 2005, 6 pp., Nature Materials Advance Online Publication, www.nature.com/naturematerials.
Mott, Nevill, "Electrons in Glass," Nobel Lecture, Dec. 8, 1977, Physics, 1977, pp. 403-413.
Oh, Hyung-Rok, et al., "Enhanced Write Performance of a 64Mb Phase-Change Random Access Memory," ISSCC 2005, Session 2, Non-Volatile Memory, 2.3, 3 pages.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al.,"Novel u Trench Phase-Change Memory Cell for Embedded and Stand-Alone Non-Volatile Memory Applications," 2004 Symposium on VLSI Technology Digest of Technical Papers, pp. 18-19.

Pirovano, Agostino et al.,"Reliability Study of Phase-Change Nonvolatile Memories," IEEE Transactions on Device and Materials Reliability, Sep. 2004, pp. 422-427, vol. 4, No. 3.

Prakash, S. et al., "A guideline for Designing Chalcogenide-Based Glasses for Threshold Switching Characteristics," IEEE Electron Device Letters, vol. 18, No. 2, Feb. 1997, pp. 45-47.

Radaelli, A. et al., "Electronic Switching Effect and Phase-Change Transition in Chalcogenide Materials," IEEE Electron Device Letters, Oct. 2004, pp. 684-686, vol. 25, No. 10.

Rochefort, C. et al., "Manufacturing of High Aspect-Ration p-n Junctions Using Vapor Phase Doping for Application in Multi-Resurf Devices," IEEE 2002, pp. 237-240.

Schafft, Harry A. et al., "Thermal Conductivity Measurements of Thin Films Silicon Dioxide," Proceedings of the IEEE 1989 International Conference on Microelectronic Test Structures vol. 2, No. 1, Mar. 1989, pp. 121-124.

Strauss, Karl F. et al., "Overview of Radiation Tolerant Unlimited Write Cycle Non-Volatile Memory," IEEE 2000, pp. 399-408.

Subramanian, Vivek et al., "Low Leakage Germanium-Seeded Laterally-Crystallized Single-Grain 100-nm TFT's for Vertical Integration Applications," IEEE Electron Device Letters, vol. 20, No. 7, Jul. 1999, pp. 341-343.

Tanaka, H., et al., "Bit Cost Scalable Technology with Punch and Plug Process for Ultra High Density Flash Memory," IEEE Symposium on VLSI Technology, Jun. 12-14, 2007, 2 pages.

Wicker, Guy et al., Nonvolatile, High Density, High Performance Phase Change Memory, 1999, http://klabs.org/richcontent/MAPLDCon99/Papers/P21_Tyson_P.PDF#search='nonvolatile%20high%20density%20high%20performance%20phase%20change%20memory', 8pages.

Wicker, Guy, "A Comprehensive Model of Submicron Chalcogenide Switching Devices," Doctoral Dissertation, Wayne State University, Detroit, MI 1996, 137 pp.

Wolf, Stanley, Excerpt from: Silicon Processing for the VLSI Era—vol. 4, pp. 674-679, 2004.

Wuttig, Matthias, "Towards a Universal Memory?" Nature Materials, Apr. 2005, pp. 265-266, vol. 4.

Yamada, Noboru, "Potential of Ge—Sb—Te phase-change optical disks for high-data-rate recording in the near future," (Conference Proceedings Paper), Jul. 30, 1997, vol. 3109, 10 pages.

Yi, J. H. et al., "Novel Cell Structure of PRAM with Thin Metal Layer Inserted GeSbTe," IEEE IEDM 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

Choi, Sung-Jin, et al., "Performance Breakthrough in NOR Flash Memory with Dopant-Segregated Schottky-Barrier (DSSB) SONOS Devices," 2009 Symposium on VLSI Technology Digest of Technical Papers, 2 pages.

* cited by examiner

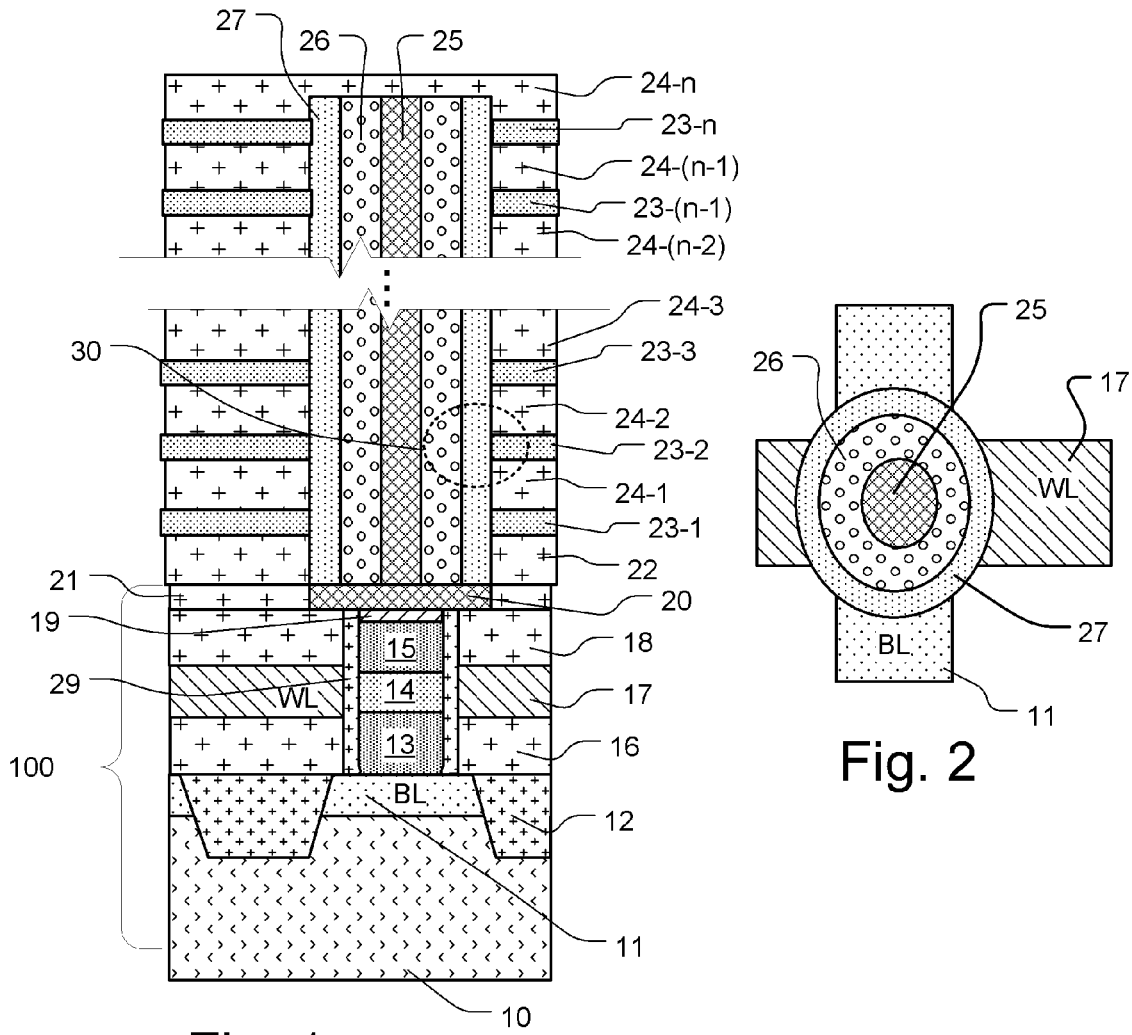
Fig. 1
Fig. 2
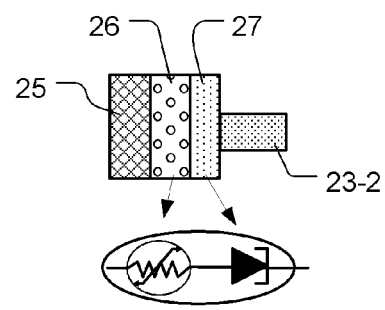
Fig. 3

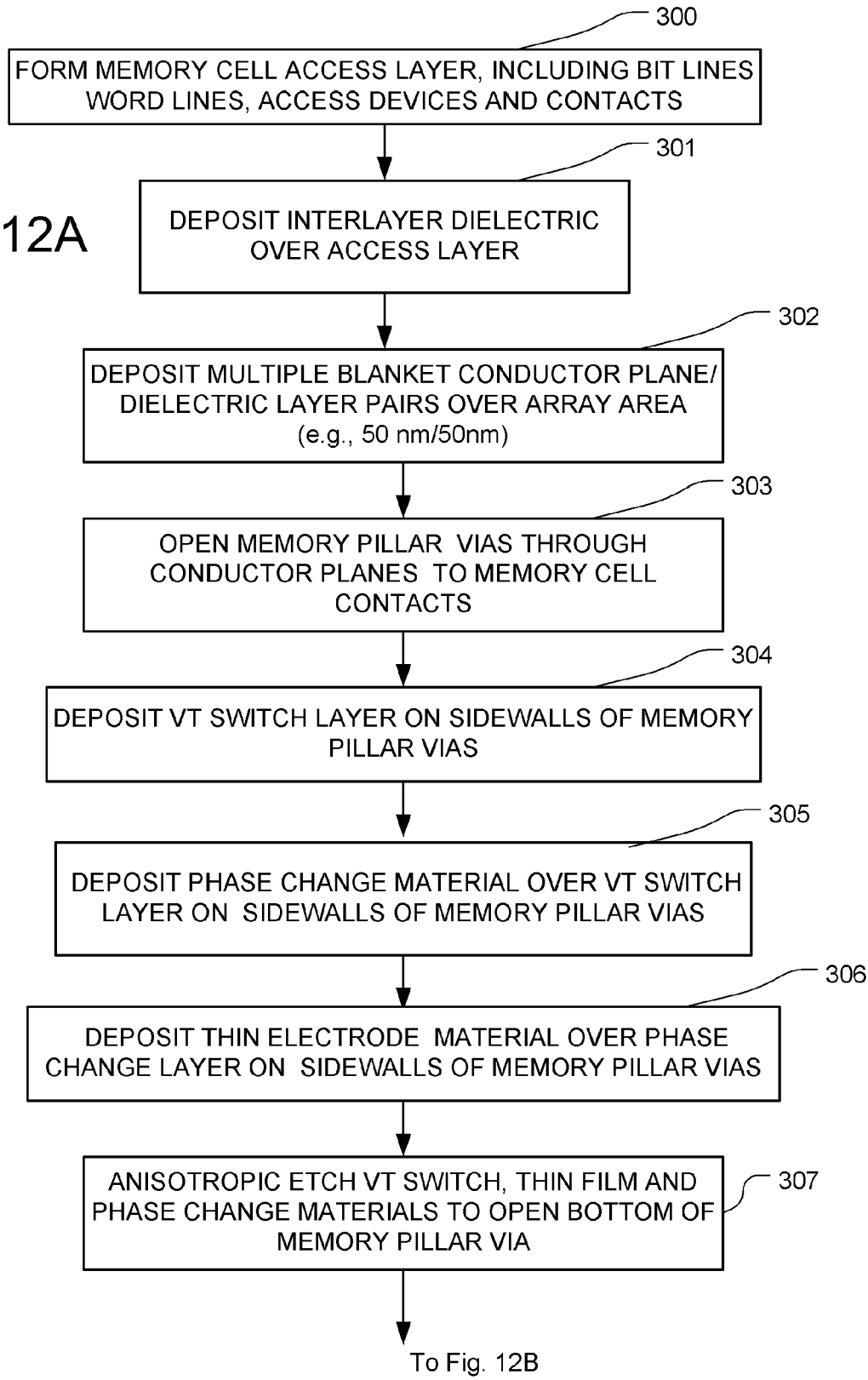

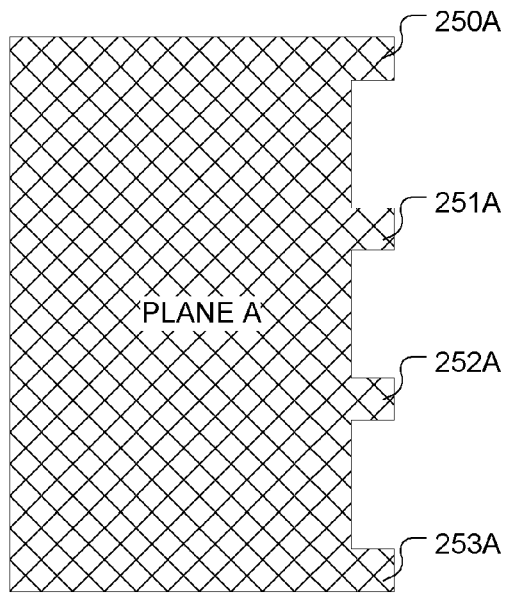 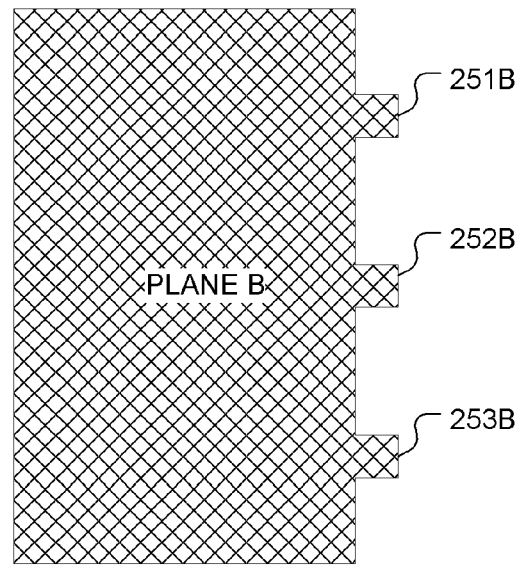
Fig. 13A  Fig. 13B
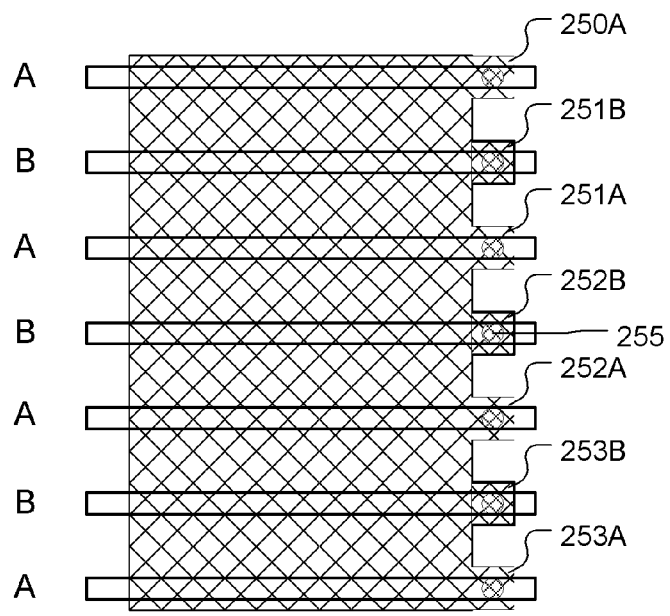
Fig. 14

INTEGRATED CIRCUIT 3D PHASE CHANGE MEMORY ARRAY AND MANUFACTURING METHOD

PARTIES TO A RESEARCH AGREEMENT

International Business Machines Corporation, a New York corporation and Macronix International Corporation, Ltd., a Taiwan corporation, are parties to a Joint Research Agreement.

BACKGROUND OF THE INVENTION

1. Field of the Invention

The present invention relates to high density phase change memory devices, and particularly to memory devices in which multiple planes of memory cells are arranged to provide a three-dimensional 3D array.

2. Description of Related Art

Phase-change-based memory materials, like chalcogenide-based materials and similar materials, can be caused to change phase between an amorphous state and a crystalline state by application of electrical current at levels suitable for implementation in integrated circuits. The generally amorphous state is characterized by higher electrical resistivity than the generally crystalline state, which can be readily sensed to indicate data. These properties have generated interest in using programmable resistance material to form nonvolatile memory circuits, which can be read and written with random access.

As critical dimensions of devices in integrated circuits shrink to the limits of common memory cell technologies, designers have been looking to techniques for stacking multiple planes of memory cells to achieve greater storage capacity, and to achieve lower costs per bit. Multilayer phase change devices have been proposed in Haring-Bolivar et al., U.S. Patent Application Publication No. US 2008/0101109, published 1 May 2008 (See, FIG. 11a). The Haring-Bolivar et al. structure consists of a number of 2D phase change memory cell arrays, arranged in a stack above one another, in which phase change memory elements arranged directly above one another are actuated and contacted by a selection transistor by way of a common via.

Multilayer processes have been explored for other memory technologies as well. For example, thin film transistor techniques are applied to charge trapping memory technologies in Lai, et al., "A Multi-Layer Stackable Thin-Film Transistor (TFT) NAND-Type Flash Memory", IEEE Int'l Electron Devices Meeting, 11-13 Dec. 2006; and in Jung et al., "Three Dimensionally Stacked NAND Flash Memory Technology Using Stacking Single Crystal Si Layers on ILD and TANOS Structure for Beyond 30 nm Node", IEEE Int'l Electron Devices Meeting, 11-13 Dec. 2006.

Also, cross-point array techniques have been applied for anti-fuse memory in Johnson et al., "512-Mb PROM With a Three-Dimensional Array of Diode/Anti-fuse Memory Cells" IEEE J. of Solid-State Circuits, Vol. 38, No. 11, November 2003. In the design described in Johnson et al., multiple layers of word lines and bit lines are provided, with memory elements at the cross-points. The memory elements comprise a p+ polysilicon anode connected to a word line, and an n-polysilicon cathode connected to a bit line, with the anode and cathode separated by anti-fuse material.

In the processes described in Haring-Bolivar et al., Lai, et al., Jung, et al. and Johnson et al., there are several critical lithography steps for each memory layer. Thus, the number of critical lithography steps needed to manufacture the device is multiplied by the number of layers that are implemented. Critical lithography steps are expensive, and so it is desirable to minimize them in manufacturing integrated circuits. So, although the benefits of higher density are achieved using 3D arrays, the higher manufacturing costs limit the use of the technology.

Another structure that provides vertical NAND cells in a charge trapping memory technology is described in Tanaka et al., "Bit Cost Scalable Technology with Punch and Plug Process for Ultra High Density Flash Memory", 2007 Symposium on VLSI Technology Digest of Technical Papers; 12-14 Jun. 2007, pages: 14-15. The structure described in Tanaka et al. includes a multi-gate field effect transistor structure having a vertical channel which operates like a NAND gate, using silicon-oxide-nitride-oxide-silicon SONOS charge trapping technology to create a storage site at each gate/vertical channel interface. The memory structure is based on a pillar of semiconductor material arranged as the vertical channel for the multi-gate cell, with a lower select gate adjacent the substrate, an upper select gate on top. A plurality of horizontal control gates is formed using planar electrode layers that intersect with the pillars. The planar electrode layers used for the control gates do not require critical lithography, and thereby save costs. However, critical lithography steps are required at the top and bottom of each of the vertical cells. Also, there is a limit in the number of control gates that can be layered in this way, determined by such factors as the conductivity of the vertical channel, program and erase processes that are used and so on.

It is desirable to provide a structure for three-dimensional integrated circuit memory with a low manufacturing cost, including reliable, very small memory elements.

SUMMARY OF THE INVENTION

A 3D memory device is based on an array of electrode pillars and a plurality of electrode planes that intersect the electrode pillars at interface regions that include phase change memory elements. The electrode pillars can be selected using two-dimensional decoding, and the plurality of electrode planes can be selected using decoding on a third dimension.

An embodiment is described comprising an integrated circuit substrate having a memory cell access layer with an array of access devices and a corresponding array of contacts on the top surface. A plurality of conductive layers lies over or under the array of access devices, separated from each other and from the array of access devices by insulating layers. An array of electrode pillars extends through the plurality of conductive layers and insulating layers. The electrode pillars are coupled to corresponding access devices, such as by contacting the contacts in the array of contacts. Memory elements are located in interface regions between the pillars and the conductive layers, where each of the memory elements comprises a programmable phase change memory element in series with a threshold switching device, such as a layer of solid electrolyte or a tunneling dielectric.

In an alternative, the array of access devices may be formed over, or between, the conductive layers using thin film transistors or related technology.

Row decoding circuits and column decoding circuits are coupled to the array of access devices and are arranged to select an electrode pillar in response to addresses. Plane decoding circuits are coupled to the plurality of conductive layers, and are arranged to select a conductive layer in response to addresses. Also, the plane decoding circuits are arranged to bias the threshold switching devices in a conducting state in the interface regions of a selected conductive layer, and bias the threshold switching devices in a non-conducting state in the interface regions of non-selected conductive layers.

Electrode pillars are described that include a conductor in the form of a core of conductive material, contacting a corresponding contact in the array of contacts, and a layer of memory material and a layer of threshold switching material between the core and the plurality of conductive layers. The programmable elements in the memory elements comprise active regions in the layer of memory material at the interface regions. The programmable elements in the memory elements comprise active regions in the layer of memory material at the interface regions between the core and the conductive layers.

Access devices in the memory cell access layer comprise vertical transistors or horizontal transistors in various embodiments described herein, with bit lines and word lines coupled to the drains and gates of the transistors.

The plurality of conductive layers is formed using a sequence of blanket deposition processes, with patterning to configure the perimeters of the layers for contact to the plane decoding circuitry. The conductive layers can be patterned using a tapered etch process, so that successive layers recede on a taper to form ledges, and contacts are formed that contact the ledges of the layers along the taper.

In another embodiment, the conductive layers have tabs along the perimeters, which are configured for contact to the decoding circuitry. The integrated circuit includes a wiring layer overlying the plurality of conductive layers, which includes conductors coupling the plurality of conductive layers to decoding circuitry. Conductive plugs contact the tabs on the plurality of conductive layers and extend upwardly to the wiring layer. The tabs are arranged in an interleaved fashion in an embodiment that reduces the footprint of the plane decoding circuits. The interleaved tabs are arranged so that conductive plugs that are coupled to interleaved tabs on two or more conductive layers are arranged in a row extending in a direction defined by the interleaved tabs.

A method for manufacturing a memory device is described that includes forming a memory cell access layer or otherwise forming an array of access devices, forming a plurality of conductive layers that overlies an array of access devices in the memory cell access layer, forming an array of electrode pillars extending through the plurality of conductive layers, with memory elements in interface regions between the electrode pillars in the plurality of conductive layers. A technique for forming the plurality of conductive layers includes, after depositing an interlayer dielectric on the top surface of the access layer, for each conductive layer executing the steps of forming a blanket layer of conductive material and forming a blanket layer of insulating material on the blanket layer of conductive material. A technique for forming an electrode pillar in the array of electrode pillars includes after providing the plurality of conductive layers, defining an electrode via through the plurality of conductive layers over one of the contacts in the array of contacts. Next, a layer of threshold switching material, such as an solid electrolyte material or a tunneling dielectric, is formed on the side walls of the electrode via. Then, a layer of phase change memory material is formed over the layer of threshold switching material. Finally, the electrode via is filled over the layer of memory material with an electrode material, using one or more layers of a conductive material such as a metal like tungsten, or a metal nitride like titanium nitride.

In one process described herein, a technique for defining a perimeter on the blanket layer of conductive material includes patterning portions of the perimeter so that they include tabs configured for contact to decoding circuitry. A plurality of conductive plugs is formed after forming a plurality of conductive layers, which contact respective tabs on the plurality of conductive layers and extend upwardly to a wiring plane overlying the plurality of conductive layers. The tabs can be arranged in an interleaved fashion, so that conductive plugs that are coupled to interleaved tabs on different conductive layers are arranged in a row, which extends in a direction defined by the interleaved tabs.

A novel three-dimensional, phase change memory cell structure is described. In one example, a word line and a bit line are used to drive an access transistor. The access transistor is connected to an electrode pillar. The electrode pillar includes a phase change material layer, and a threshold switching layer on the phase change material layer. A sidewall of the electrode pillar is contacted by multiple layers of conductive material. The interface region between each conductive layer and the perimeter of the electrode pillar provides a memory cell.

A memory cell is programmed by enabling one word line and one bit line coupled to the access transistor for a selected pillar. The voltage bias between the pillar and a selected conductive layer will bias the threshold switching material in a conducting state, and program an active region of the phase change material in the interface region. Information is read out by sensing the current on a selected bit line or on one of the conductive layers coupled with a selected memory cell.

Other aspects and advantages of the present invention can be seen on review of the drawings, the detailed description and the claims, which follow.

BRIEF DESCRIPTION OF THE DRAWINGS

FIG. 1 is a cross-section of a vertical FET access device and a multilevel electrode pillar including a plurality of memory elements for a device as described herein.

FIG. 2 is a top view of a multilevel electrode pillar with the conductive layers removed.

FIG. 3 illustrates an interface region on the multilevel electrode pillar including a memory element and a threshold switching element.

FIGS. 12A-12B are a flow chart for a method for manufacturing a memory array as described herein.

FIGS. 13A-13B illustrate the layout of conductive layers including interleaved tabs arranged for making contact with interconnect vias and plugs.

FIG. 14 shows a top view of the conductive layers including interleaved tabs and overlying wiring for interconnecting with decoding circuitry.

DETAILED DESCRIPTION

Figure 4:
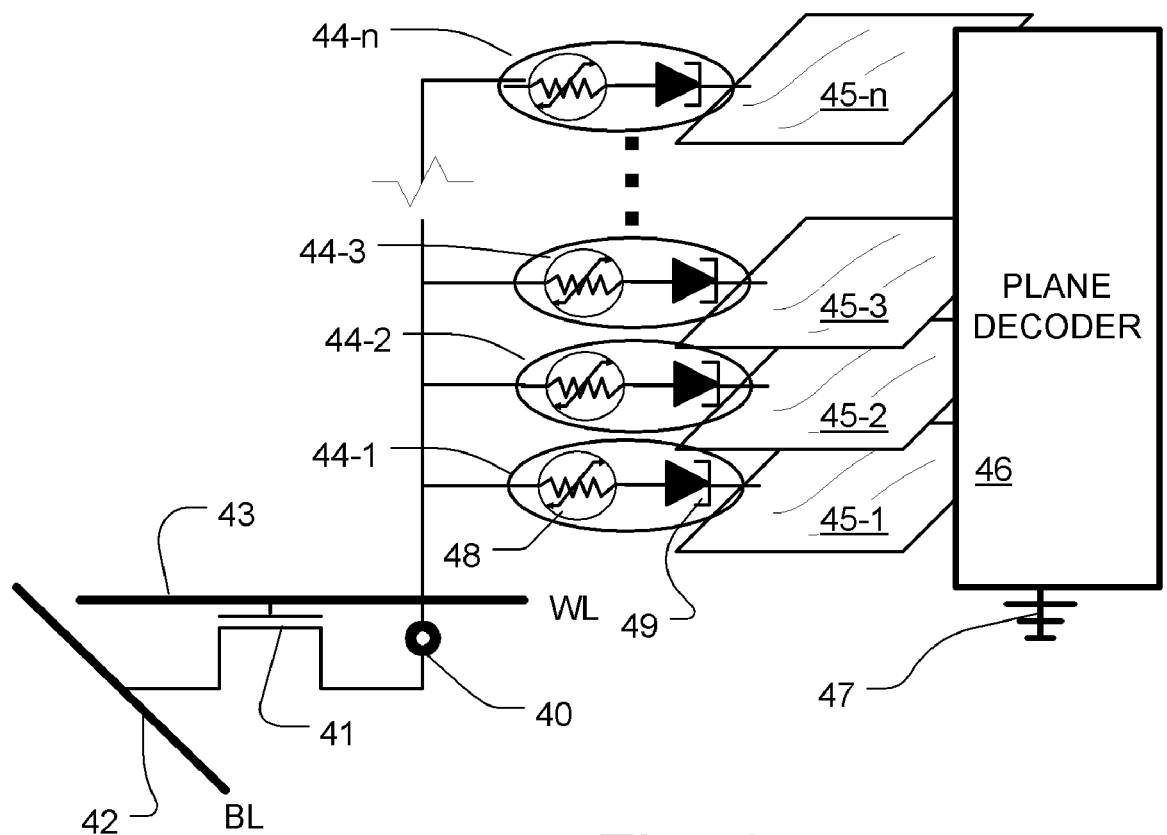
FIG. 4 is a schematic diagram of an access device and multilevel electrode pillar, such as shown in FIG. 1.

A detailed description of embodiments of the present invention is provided with reference to the FIGS. 1-16.

FIG. 1 is a cross-section of a multilevel memory cell. The memory cell is formed on an integrated circuit substrate that in this example includes a semiconductor body 10 with trench isolation structures 12 patterned in rows on the surface. Between the trench isolation structures 12, implants are deposited to form buried diffusion bit lines 11. An access device for a single memory cell pillar is shown which consists of a vertical FET transistor having a drain 13, a channel 14, and a source 15 surrounded by a gate dielectric layer 29. An insulating layer 16 overlies the semiconductor body 10. A word line 17 traverses the array and surrounds the channel 14 of the vertical FET. An insulating layer 18 overlies the word line in this example. A silicide layer 19 is formed on top of the source 15. In this example, a tungsten contact pad 20 is defined and patterned on the silicide layer 19. An insulating layer, including in this example layer 21 and layer 22 overlies the contact pad 20. The parts of the structure shown in the figure from the contact pad 20 to the semiconductor bodies 10 (e.g. bulk silicon) are part of an integrated circuit substrate including a memory cell access layer 100.

A plurality of conductive layers 23-1 through 23-$n$ overlies the contact pad 20 and insulating layer 22. Insulating layers 24-1 through 24-($n$–1) separate the conductive layers 23-1 through 23-$n$ from one another. The conductive layers 23-1 through 23-$n$ may comprise refractory metals such as W, or other materials, for example, TiN or TaN. Alternatively, the conductive layers 23-1 through 23-$n$ may comprise, for example, one or more elements from the group of Ti, Mo, Al, Ta, Cu, Pt, Ir, La, Ni, N, O, and Ru. In other embodiments, the conductive layers 23-1 through 23-$n$ may comprise doped polysilicon, other doped semiconductor materials.

Insulating layer 24-$n$ covers the top conductive layer 23-$n$. In alternative embodiments, the array of access devices may be formed over the plurality of conductive layers, or between conductive layers, using thin film transistor techniques for example.

An electrode pillar for a multilevel memory consists of a conductor including a central conductive core 25 made for example of tungsten or other suitable electrode material, surrounded by a layer 26 of phase change memory material and a layer 27 of threshold switching material over the layer 26 of phase change memory material, where the threshold switching material contacts, or is otherwise in electrical current communication with the plurality of conductive layers.

Interface regions, such as the region 30, between the plurality of conductive layers 23-1 through 23-$n$ and the pillar include phase change memory elements comprising a programmable element in series with a threshold switching element as explained in more detail below with reference to FIG. 3.

Layer 26 includes phase change based memory materials, such as chalcogenide based materials and other materials. Chalcogens include any of the four elements oxygen (O), sulfur (S), selenium (Se), and tellurium (Te), forming part of group VIA of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from group IVA of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_a Ge_b Sb_{100-(a+b)}$. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky U.S. Pat. No. 5,687,112 patent, cols. 10-11.) Particular alloys evaluated by another researcher include $Ge_2Sb_2Te_5$, $GeSb_2Te_4$ and $GeSb_4Te_7$ (Noboru Yamada, "Potential of Ge—Sb—Te Phase-Change Optical Disks for High-Data-Rate Recording", SPIE v. 3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistance properties. Specific examples of memory materials that may be useful are given in Ovshinsky '112 at columns 11-13, which examples are hereby incorporated by reference.

Chalcogenides and other phase change materials are doped with impurities in some embodiments to modify conductivity, transition temperature, melting temperature, and other properties of memory elements using the doped chalcogenides. Representative impurities used for doping chalcogenides include nitrogen, silicon, oxygen, silicon dioxide, silicon nitride, copper, silver, gold, aluminum, aluminum oxide, tantalum, tantalum oxide, tantalum nitride, titanium and titanium oxide.

Phase change alloys are capable of being switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change alloy. In following sections of the disclosure, the phase change material is referred to as GST, and it will be understood that other types of phase change materials can be used. A material useful for implementation of a PCRAM described herein is $Ge_2Sb_2Te_5$.

An exemplary method for forming chalcogenide material uses PVD-sputtering or magnetron-sputtering method with source gas(es) of Ar, $N_2$, and/or He, etc. at the pressure of 1 mTorr~100 mTorr. The deposition is usually done at room temperature. A collimator with an aspect ratio of 1~5 can be used to improve the fill-in performance. To improve the fill-in performance, a DC bias of several tens of volts to several hundreds of volts is also used. On the other hand, the combination of DC bias and the collimater can be used simultaneously.

Another exemplary method for forming chalcogenide material uses chemical vapor deposition CVD such as that disclosed in US Publication No 2006/0172067 entitled "Chemical Vapor Deposition of Chalcogenide Materials", which is incorporated by reference herein.

A post-deposition annealing treatment in a vacuum or in an $N_2$ ambient is optionally performed to improve the crystallized state of chalcogenide material. The annealing temperature typically ranges from 100° C. to 400° C. with an anneal time of less than 30 minutes.

FIG. 2 shows a top view layout of an electrode pillar including the conductive core 25, the layer 26 of phase change material and the layer 27 of threshold switching material. The bit lines 11 are laid out in a first direction, and the word lines 17 are laid out in an orthogonal direction. The electrode pillars are surrounded by an annular layer 27 of threshold switching material. The ring shaped interfaces between the layer of threshold switching material in the pillar and each of the layers of conductive material define the interface regions including memory elements.

FIG. 3 shows a portion of a memory element, such as in interface region 30, including conductive layer 23-2, layer 26 of phase change material, conductive core 25, and the layer 27 of threshold switching material. In the native state, a layer 26 of phase change material can have a thickness on the order of 5 to 50 nanometers. An active region is formed adjacent each conductive layer, which changes resistance in response to setting and resetting pulses, applied under control of on-chip control circuits as described below with reference to FIG. 16. A read pulse may comprise a 1 to 2 volt pulse having a pulse width that depends on the configuration, applied under control of on-chip control circuits as described below with reference to FIG. 19. The read pulse can be much shorter than the programming pulse.

Threshold switching materials used in layer 27 are characterized by having low conductivity at relatively low voltages encountered by unselected cells on a pillar, and having relatively high conductivity at operating voltages for reading, setting and resetting encountered by selected cells on a pillar. The threshold switching layer 27 can be implemented using materials such as solid electrolyte like for example germanium silicide, or other suitable material. See U.S. Pat. No. 7,382,647 by Gopalakrishnan for other representative solid electrolyte materials. Alternatively, a tunneling dielectric layer, such as a layer of silicon dioxide having thickness on the order of 10 to 50 nanometers may be used as a threshold switching material, in which a low electric fields allows negligible tunneling current, and at higher electric fields allows greater tunneling current as required for reading, setting and resetting the active region in the memory material.

FIG. 4 is a schematic illustration of the structure of FIG. 1. An electrode pillar 40 is coupled to an access transistor 41 which is selected using the bit line 42 and word line 43. A plurality of memory elements 44-1 through 44-n are connected to the pillar 40. Each of the memory elements includes a programmable element 48 in series with a threshold switching element 49. This series circuit schematic represents the structure shown in FIG. 3. The programmable element 48 is represented by a symbol often used to indicate programmable resistance.

Each of the memory elements 44-1 through 44-n is coupled to a corresponding electrode plane 45-1 through 45-n, where the electrode planes are provided by the conductive layers of material described herein. The electrode planes 45-1 through 45-n are coupled to a plane decoder 46 which is responsive to addresses to apply a voltage, such as ground 47, to a selected electrode plane so that the threshold switching element in the memory element is conducting, and to apply a voltage to or to float an unselected electrode plane so that the threshold switching element in the memory element is non-conducting.

Figure 5:
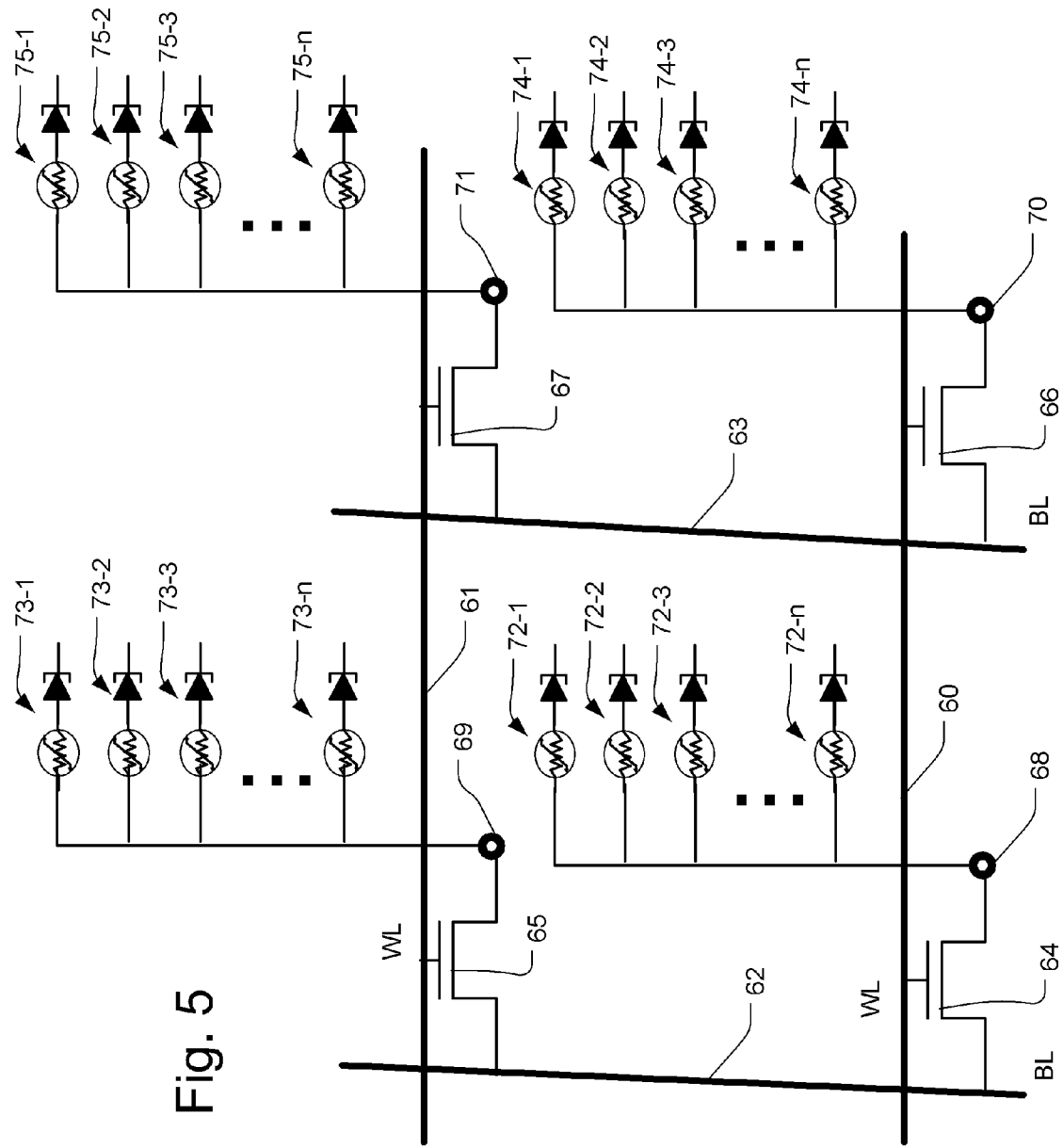
FIG. 5 a schematic diagram of a 2×2×n portion of a memory array composed of multilevel electrode pillars.

FIG. 5 provides a schematic representation of a 2word-lines×2 bitlines×n planes, three-dimensional 3D memory array. The array includes word lines 60 and 61, which are intersected by bit lines 62 and 63. Access devices 64, 65, 66 and 67 lie at the crosspoints between the bit lines and the word lines. Each access device is coupled to a corresponding electrode pillar 68, 69, 70, 71. Each electrode pillar includes a stack of memory elements that is a number "n" planes deep. Thus, pillar 68 is coupled to memory elements 72-1 through 72-n. Pillar 69 is coupled to memory elements 73-1 through 73-n. Pillar 70 is coupled to memory elements 74-1 through 74-n. Pillar 71 is coupled to memory elements 75-1 through 75-n. The conductive layers are not illustrated in FIG. 5 to avoid crowding the drawing. The 2×2 ×n array shown in FIG. 5 can be extended to arrays that are thousands of word lines by thousands of bit lines with any number of planes. In representative embodiments, the number n of planes can be powers of 2 to facilitate binary decoding, such as 4, 8, 16, 32, 64, 128 and so on.

Figure 6:
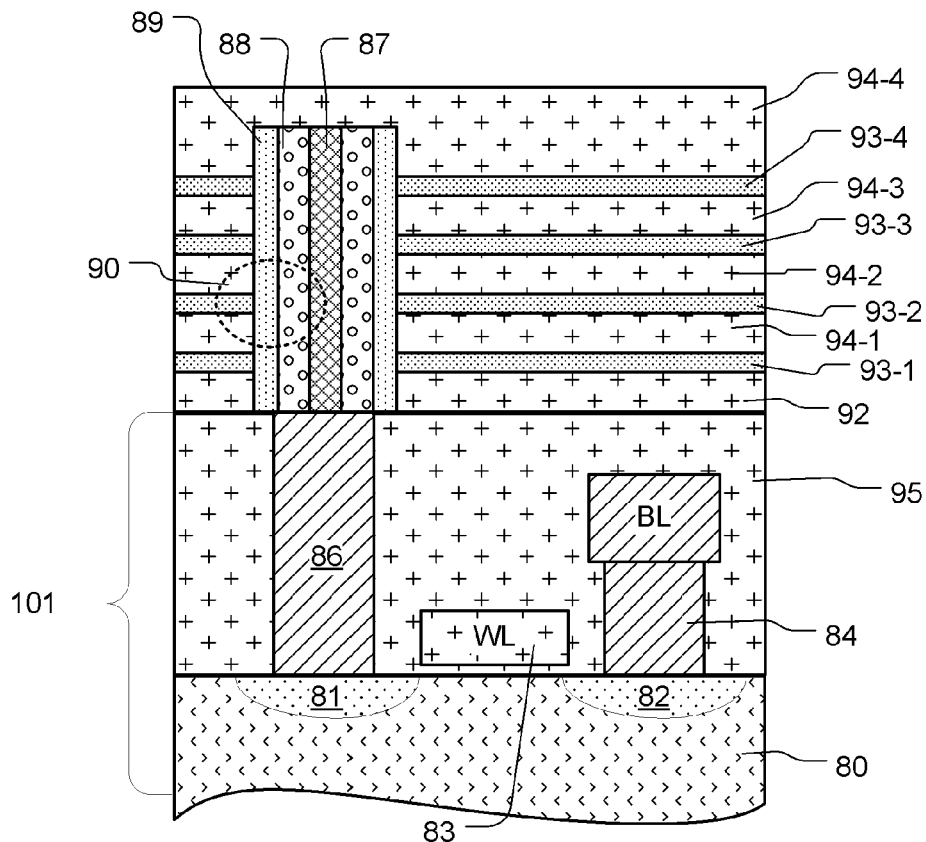
FIG. 6 is a cross-section of a horizontal FET access device in a multilevel electrode pillar including a plurality of memory elements for a device as described herein.

FIG. 6 is a cross-section of a multilevel memory cell having a horizontal FET access device. The memory cell is formed on an integrated circuit substrate that in this example includes a semiconductor body 80. Optional trench isolation structures (not shown) can be formed on the surface to isolate regions of the device. Implants are deposited to form source 81 and drain 82 for the access device. A word line 83 is formed between the source 81 and drain 82 over a gate dielectric. An interlayer dielectric 95 overlies the word line in the semiconductor body 80. Plug 84 and plug 86 are formed in the interlayer dielectric 95. Plug 84 extends to a patterned metal layer including bit line BL. Plug 86 extends to a surface of the interlayer dielectric 95 and provides a contact on which the electrode pillar is formed. Thus the memory cell access layer 101, as identified by the bracket in the embodiment of FIG. 6, includes the elements from the surface of the interlayer dielectric 95 to the semiconductor body 80.

A plurality of conductive layers 93-1 through 93-4 in this example overlies an insulating layer 92 that is formed over the top surface of the memory cell access layer 101. Insulating layers 94-1 through 94-3 separate the plurality of conductive layers. Insulating layer 94-4 overlies the conductive layer 93-4.

A multilevel electrode pillar consists of the conductive core including a central conductive core 87 surrounded by a layer 88 of phase change memory material. A layer 89 of threshold switching material is formed between the layer 88 of phase change memory material and a plurality of conductive layers 93-1 through 93-4, providing memory elements (e.g. element 90) in the interface region.

Figure 7:
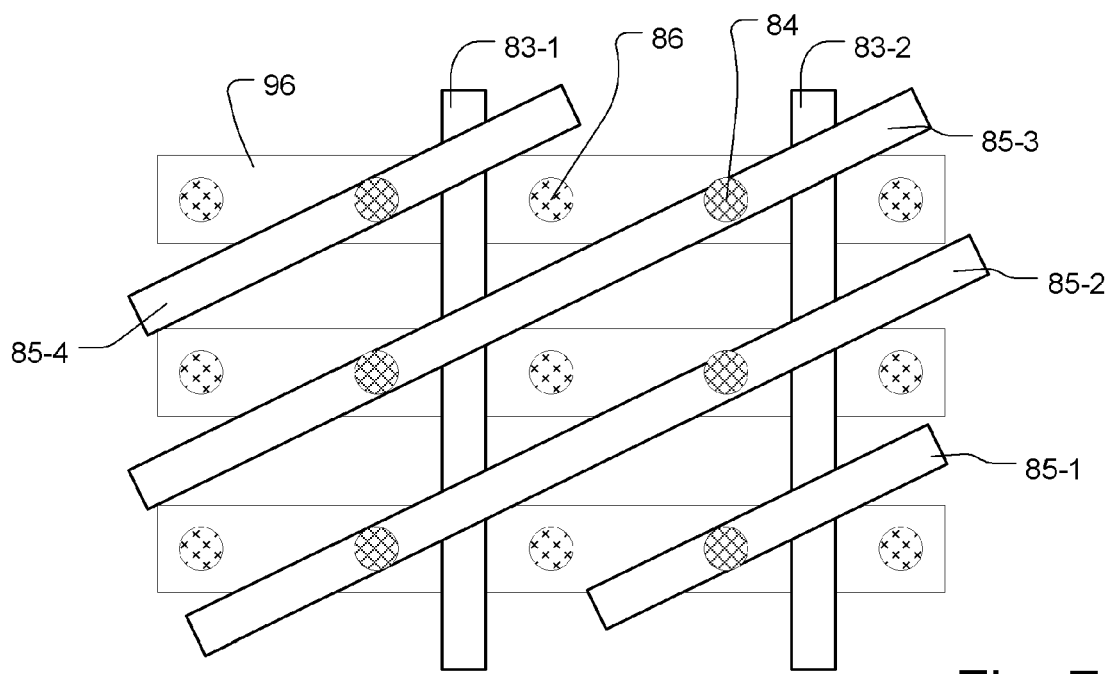
FIG. 7 is a layout view showing word lines and bit lines for a memory array implemented as shown in FIG. 7.

FIG. 7 shows a layout view for an array made using access devices like the horizontal FET shown in FIG. 6. The array includes contact plugs 86 for electrode pillars and contact plugs 84 for bit lines. The bit lines 85-1 through 85-4 are arranged diagonally. The word lines 83-1 through 83-2 are arranged vertically in this layout. The active regions 96 for the access devices are patterned as shown, so that they are essentially orthogonal to the word lines 83-1, 83-2. Trench isolation structures (not shown) can optionally be formed in parallel with the word lines 83-1, 83-2, between the columns of contact plugs 86 and columns of contact plugs 84 in adjacent access transistors.

Figure 8A:
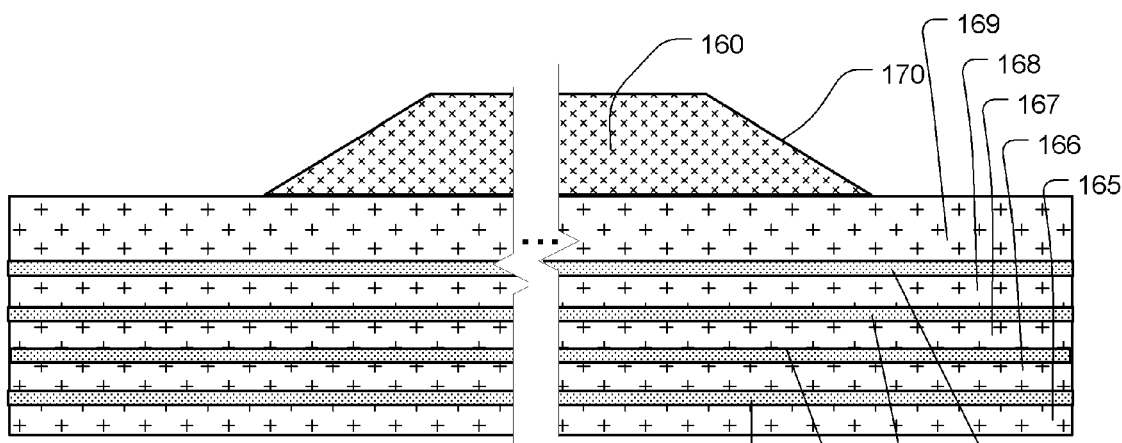
FIGS. 8A-8C illustrate stages in a process for patterning the perimeter of the conductive layers, based on a tapered etch.
Figure 8B:
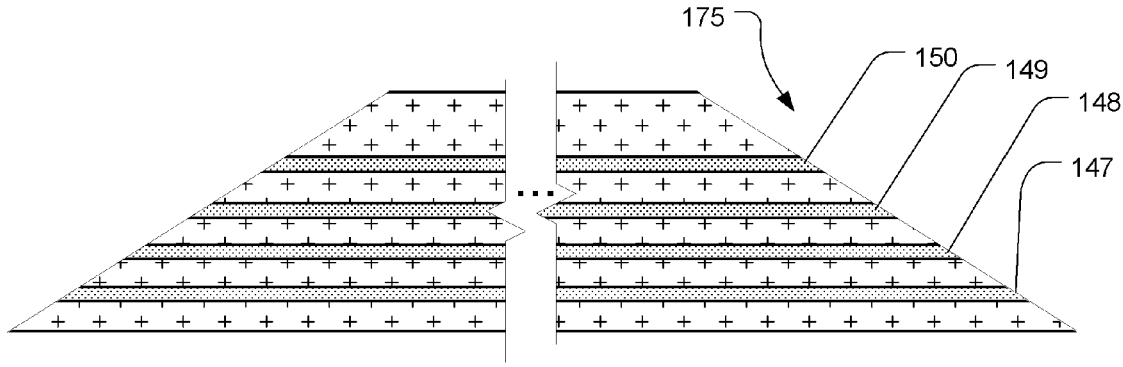
Figure 8C:
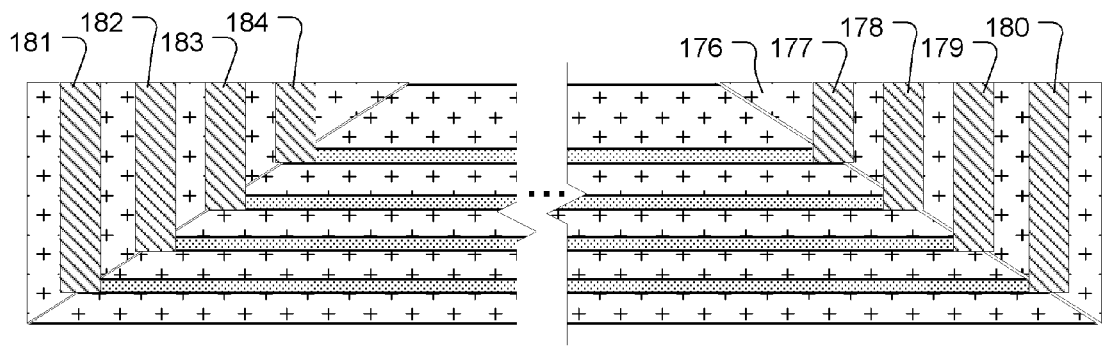

FIGS. 8A, 8B and 8C illustrate stages in a process for defining the perimeters of the layers of conductive material in order to make contact to the individual layers for decoding. In FIG. 8A, a stack is illustrated including alternating conductive layers 147, 148, 149 and 150 and insulating layers 165, 166, 167, 168 and 169. The conductive layers and insulating layers are deposited in alternating blanket depositions, which can cover the entire memory area on the integrated circuit as indicated by the break lines in the drawing. In order to pattern the perimeters of the conductive layers, a mask 160 is formed. The mask 160 has tapered sides 170. In order to make the mask, a layer of hard mask material such as silicon nitride can be deposited over the structure. A layer of photoresist can then be patterned and etched to define the tapered sides on the photoresist. The resulting structure is then etched, with the taper in the photoresist layer being transferred to a corresponding taper 170 on the hard mask 160.

As illustrated in FIG. 8B, the tapered hard mask 160 is then used in a similar manner. An etching process, such as a reactive ion etch RIE, is applied so that the taper 170 on the hard mask is transferred to a corresponding taper 175 in the stack of conductive layers. In some embodiments, the hard mask might be omitted, and the tapered photoresist element is used during the taper etch of the stack. The edges of the conductive layers 150-147 are staggered to form shelves around their perimeters. The widths of the shelves caused by the stagger between each layer can be determined by the thicknesses of the insulating layers between the conductive layers, and the slope of the taper 175.

The etching process used to define the taper 170 on the hard mask and the taper 175 on the stack of conductive layers can be one continuous etching process. Alternatively, a first process can be used to define the taper 170 on the hard mask 160, at a second etch process used to define the taper 175 on the stack of conductive layers.

FIG. 8C illustrates a next stage in the process. After forming the taper 175, an insulating fill 176 is deposited and planarized over the stack of conductive layers 150-147. Then, vias are defined using a lithographic step which patterns all of the vias for all the layers at the same time. An etching process is applied which is highly selective for the conductive material in the conductive layers 150-147, relative to the fill layer 176. In this way, the etching process within each of the vias stops on the corresponding conductive layer. The vias are then filled with plugs 177, 178, 179, 180 on one side of the perimeter of the memory array area, and plugs 181, 182, 183, 184 on another side of the perimeter memory array area. Thus, the perimeters of the conductive layers are patterned and contact vias are formed using only one lithographic step to define a hard mask 160, and one lithographic step to define the location of the vias used for the contact plugs 177-184. Also, only two (or possibly three) etch processes are applied to create the structure shown in FIG. 9C.

Figure 9:
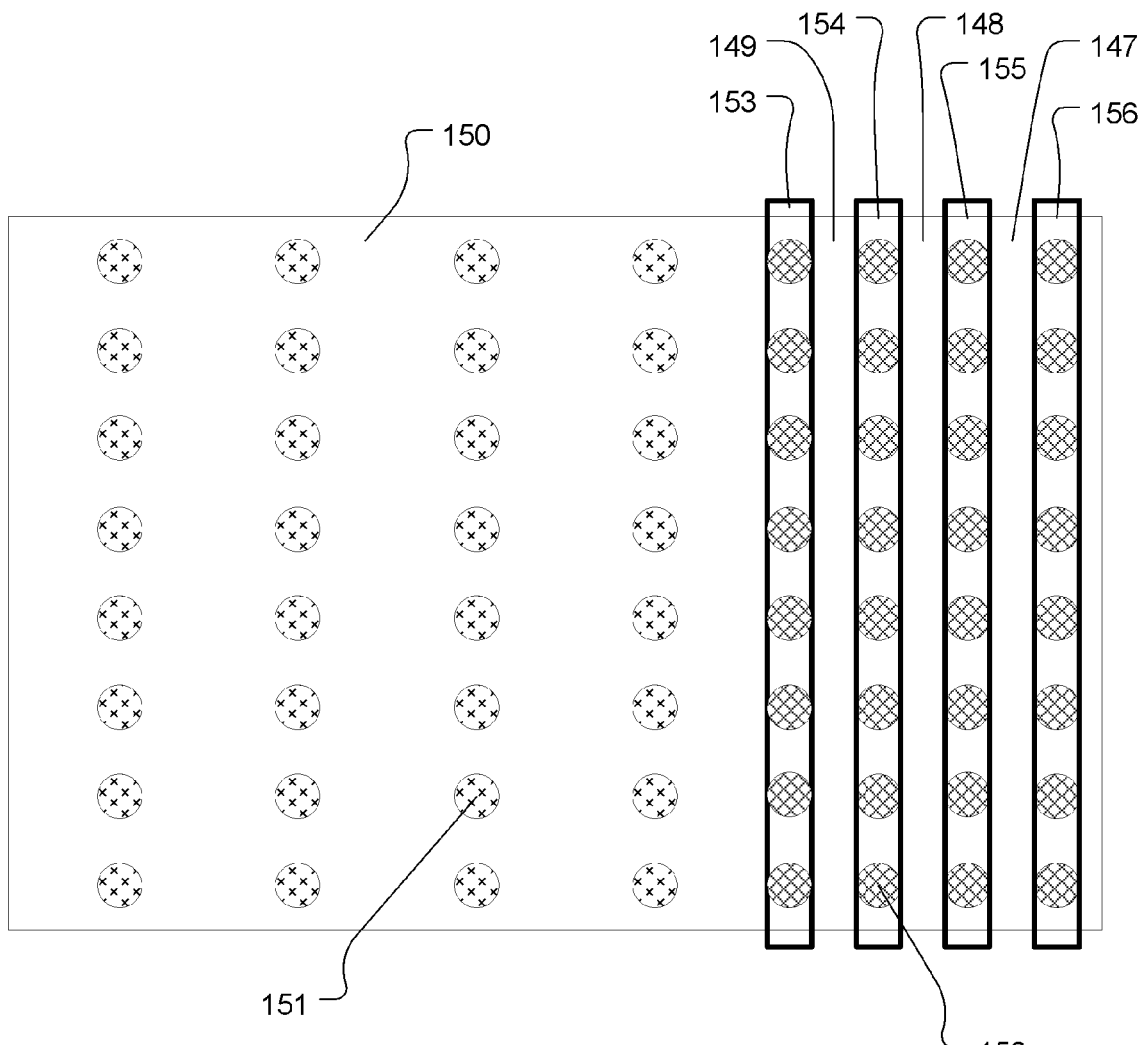
FIG. 9 is a layout view of a conductive layer and interconnect wiring for connecting the conductive layers to plane decoding circuitry.

FIG. 9 is a simplified layout view of a portion of the array, showing overlying interconnects for connecting the stack of conductive layers to plane decoding circuits. In FIG. 9, the top dielectric layer 150 is illustrated. An array of electrode pillars (e.g. pillar 151) penetrates the dielectric layer 150.

Contact plugs, such as plug 152, which correspond with the plugs 177-184 in FIG. 8C, are arranged along the perimeters of the conductive layers. The contact plugs in a row along the edge of the layer 150 are coupled to an interconnect wire 153 overlying the stack of conductive layers.

Conductive layer 149 extends to the right of the interconnect wire 153, and contact plugs in a row along the edge of layer 149 are coupled to the interconnect wire 154. Conductive layer 148 extends to the right of the interconnect wire 154, and contact plugs in a row along the edge of layer 148 are coupled to the interconnect wire 155. Conductive layer 147 extends to the right of the interconnect wire 155, and contact plugs in a row along the edge of layer 147 are coupled to the interconnect wire 156.

A simplified view of the interconnect wiring 153-156 overlying the array is intended to illustrate a manner of coupling the plurality of conductive layers in the memory array to interconnect wiring. It can then be routed as necessary to plane decoding circuitry. Also, the interconnect wiring can be arranged to distribute the bias voltages applied to the layers of conductive material more uniformly across the area of the array.

Figure 10:
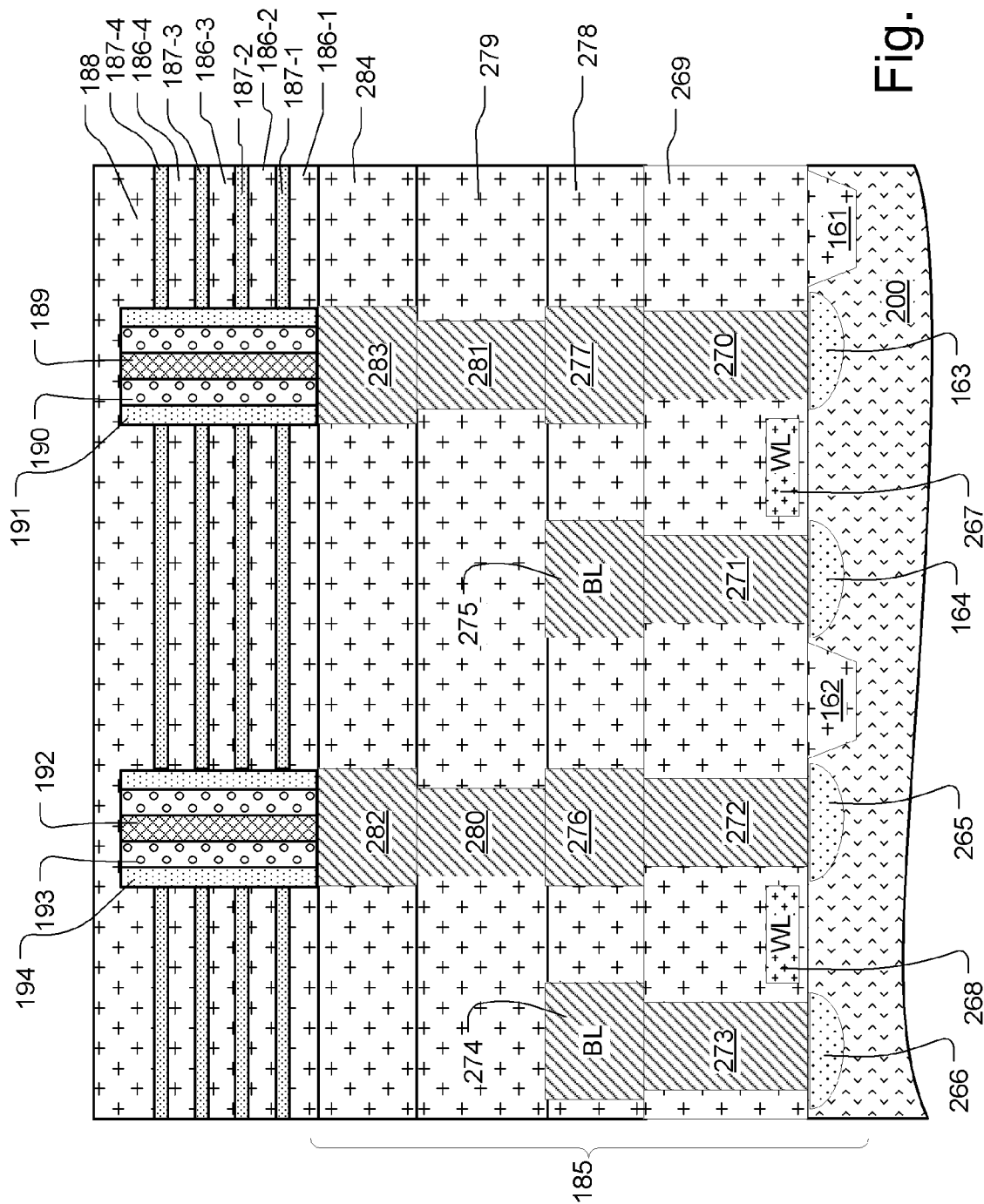
FIG. 10 is a cross-section of a portion of a memory array including horizontal FET access devices
Figure 11:
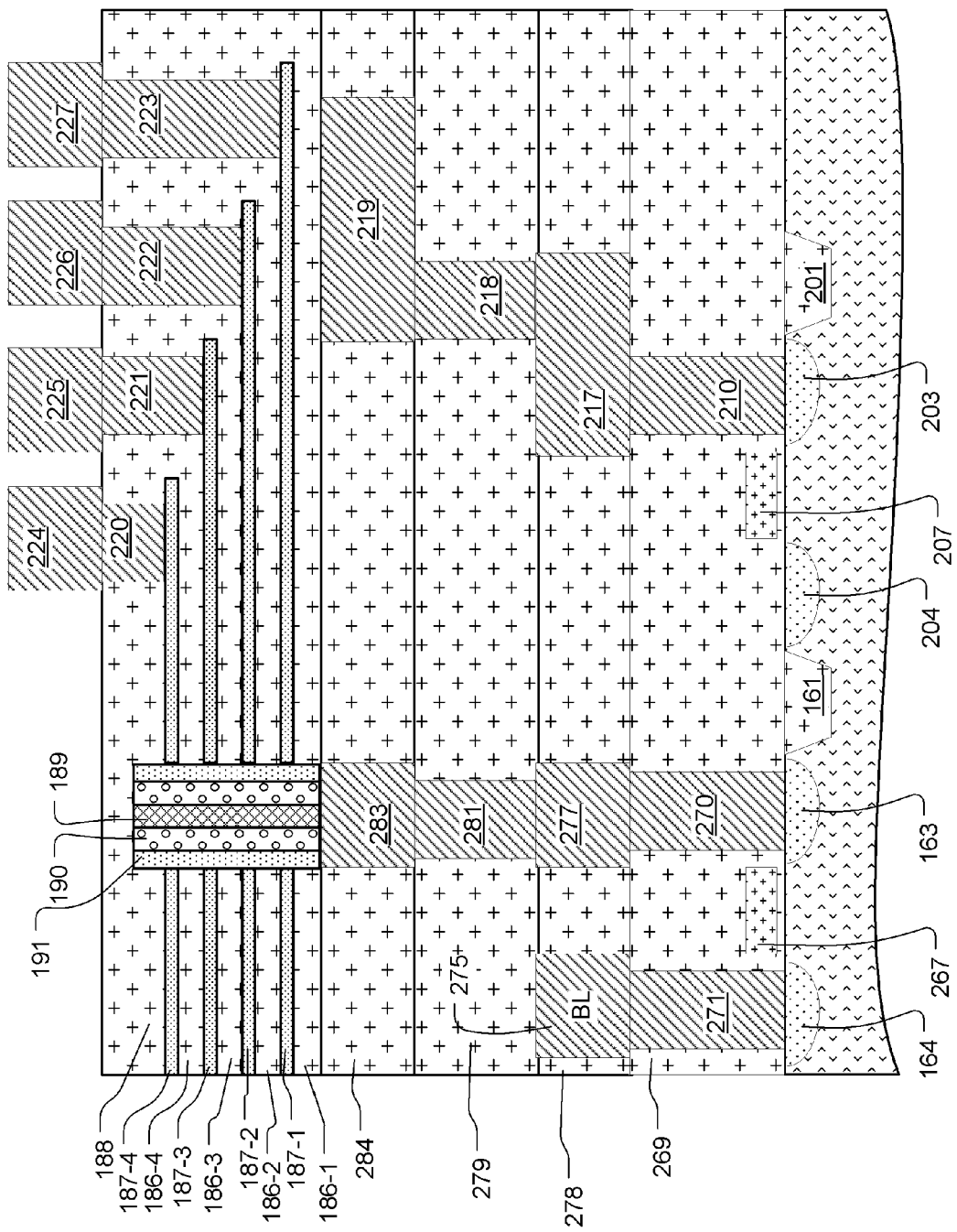
FIG. 11 is a cross-section of another portion of a memory array including horizontal FET access devices, and interconnect plugs and vias on the perimeters of the conductive layers.

FIGS. 10 and 11 together show a cross-section of a portion of an integrated circuit including a 3D phase change memory array, and a memory cell access structure that includes multiple metallization layers and peripheral circuitry. Also, FIGS. 10 and 11 can be referred to during the description of the manufacturing method set forth below with reference to FIGS. 12A-12B.

FIG. 10 shows a portion of the memory array formed on the substrate 200. Horizontal FET's are defined by source regions 163, 265 and drain regions 164, 266 in the substrate 200. Trench isolation structures 161 and 162 isolate regions in the substrate. Word lines 267 and 268 provide gates for the access devices. Interlayer dielectric 269 overlies the word lines 267, 268 and substrate. Contact plugs 270, 271, 272 and 273 extend through the interlayer dielectric 269 to an overlying metallization plane with dielectric fill 278 including bit lines 275 and 274 coupled to contacts 271 and 273. Contact pads 277 and 276 extend through the dielectric fill 278 to overlying contacts 280 and 281, which extend through another interlayer dielectric 279. Another metallization plane with dielectric fill 284 overlies the dielectric layer 279. Contact pads 282 and 283 are coupled to the underlying contacts 280 and 281, providing connection to the access devices below. The memory cell access layer 185 in this embodiment includes the components from the contact pads 282, 283 through the access transistors that include the source and drain regions 163, 164, 265, 266 in the substrate 200. The substrate 200 can comprise bulk silicon or a layer of silicon on an insulating layer or other structures known in the art for supporting integrated circuits.

A plurality of electrode pillars is arranged on top of the memory cell access layer 185. In this drawing, a first electrode pillar including conductive core 192, layer 193 of phase change material, and threshold switching material layer 194, and a second electrode pillar including conductive core 189, layer 190 of phase change material, and threshold switching material layer 191 are illustrated. The first electrode pillar is coupled to the pad 282. The second electrode pillar is coupled to the pad 283. An insulating layer 186-1 overlies the memory cell access layer 185. Conductive layer 187-1 overlies the insulating layer 186-1. Alternating conductive layers 187-2 through 187-4, and insulating layers 186-2 through 186-4 are formed on top of the conductive layer 187-1. A dielectric fill 188 overlies the structure and has a planar top surface.

FIG. 11 shows a continuation of the device out into the periphery region where supporting circuitry is formed and contacts are made to the plurality of conductive layers. In FIG. 12, the electrode pillar including conductive core 189, layer 190 of phase change material, and threshold switching material layer 191 are illustrated, and the same reference numerals are applied as are used in FIG. 10. As shown in FIG. 11, a peripheral device includes a transistor formed by source 204, gate 207 and drain 203. Trench isolation structure 201 is illustrated in the drawing. A wide variety of devices are implemented in the periphery to support decoding logic and other circuits on the integrated circuit. The multiple metallization planes are used in the periphery circuit for wiring interconnects. Thus, a contact plug 210 extends from drain 203 to a wire 217 in an upper layer. Plug 218 extends from the wire 217 to wire 219 in another layer.

The conductive layers 187-1 through 187-4 are coupled to corresponding contact plugs 223, 222, 221, 220. Interconnect wires 224 through 227 are coupled to the plugs and provide for interconnection between the plurality of conductive layers and decoding circuitry in the periphery of the device.

Figure 12B:
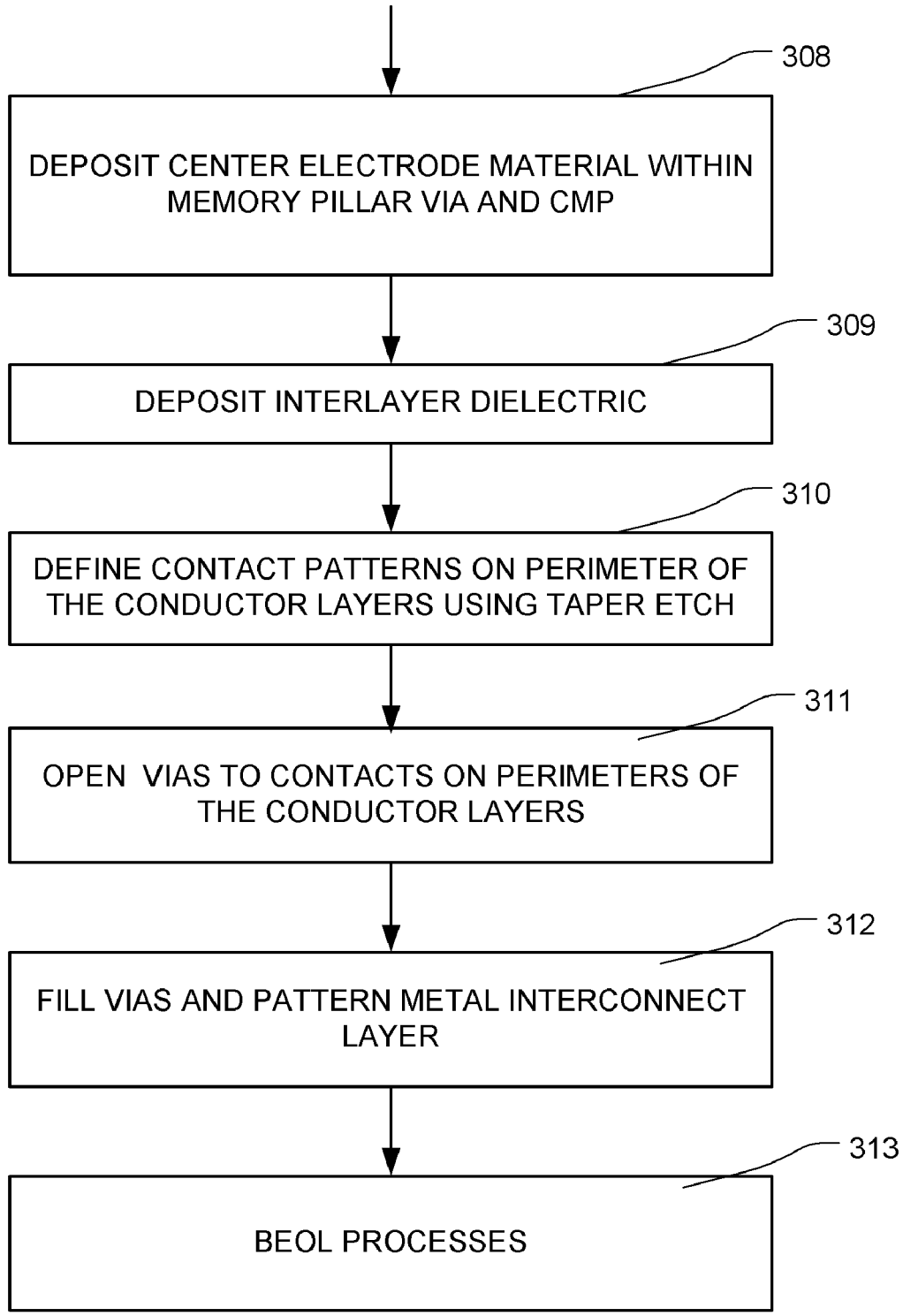

FIGS. 12A and 12B include a flow chart for a manufacturing method which can be applied to make the structure shown in FIGS. 10 and 11. For the purposes of this application, the first step 300 involves forming the memory cell access layer, including bit lines, word lines, access devices (including either vertical or horizontal transistors) and contacts. At this stage, peripheral circuitry on the integrated circuit substrate is also formed as shown in FIG. 11. As a result of this process, a top surface of the memory cell access layer in the memory region of the device has an array of contacts, including contacts 282, 283 of FIG. 10. At this stage, standard manufacturing techniques have been applied including all the necessary patterning and etching steps needed for forming the peripheral circuitry and the access devices. The contacts and interconnects involved in the memory cell access layer should be made using a refractory metal, such as tungsten, so that the thermal budget involved in the deposition of a large number of layers of conductive material will not interfere with the underlying interconnects.

Next, an interlayer dielectric (e.g. 186-1) is deposited over the memory cell access layer (301). The interlayer dielectric can be silicon dioxide, silicon oxide nitride, silicon nitride or other interlayer dielectric materials. Next, alternating blanket depositions of conductive layers and dielectric layers are performed (302). These blanket depositions provide the plurality of conductive layers (e.g. 187-1 through 187-4) acting a electrode planes. A typical thickness for the conductive layers can be on the order of 50 nanometers. The dielectric layers form the insulation between the conductive layers. The thicknesses of the insulating layers can also be on the order of 50 nanometers in one example. Other examples will include larger or smaller thicknesses for the conductor materials, and dielectric layers as desired or required for particular implementations. In a next stage, a lithographic pattern is applied to define and open vias for the memory cell pillars through the plurality of conductor planes to corresponding contacts on the memory cell access layer (303). Reactive ion etching process can be applied to form deep, high aspect ratio holes through the silicon dioxide and conductor layers to provide vias for the electrode pillars.

After opening the vias, a layer of threshold switching material is deposited on the side walls of the electrode pillar vias (304). The threshold switching material can be deposited using atomic layer deposition or chemical vapor deposition technologies.

After formation of the threshold switching layer, a layer of phase change material is deposited over the threshold switching material on the side walls of the electrode pillar vias (305). Next a thin layer of electrode material is deposited over the layer of phase change material to protect the phase change layer during a subsequent etch (306).

The resulting layers of threshold switching material, thin film electrode material and phase change material are anisotropically etched to open the bottom of the electrode pillar via, exposing the underlying contact (307). In a next step, the center electrode material is deposited within the electrode pillar via (308). The center electrode material can be the same as or different than the electrode material used for the thin film formed in step 306. After depositing the center electrode material, the resulting structure is etched back and planarized, using a chemical mechanical polishing process or other planarizing process.

Next, an interlayer dielectric is deposited over the structure (block 309).

After forming the plurality of conductive layers, contact areas are defined on the perimeters of the conductive layers using the taper etch process (310) described above with reference to FIGS. 8A-8C. Alternative techniques can be used for defining contact areas on the plurality of conductive layers. Alternative techniques may involve lithographic steps at other stages in the process, as will be understood according to the techniques applied. After patterning the perimeters of the conductive layers, an insulating fill is deposited and planarized over the structure. Then, vias are opened through the insulating fill to contacts on the perimeters of the conductive layers (311).

The vias are filled using tungsten or other contact material, and metallization processes are applied to provide interconnection between the contacts to the conductive layers and plane decoding circuitry on the device (312). Finally, back end of line BEOL processes are applied to complete integrated circuit (313).

FIGS. 13A and 13B illustrate patterns for conductive layers in the plurality of conductive layers that can be applied to establish interconnect contacts on the perimeter of the planes, which include interleaved tabs. Thus, FIG. 13A shows plane A and FIG. 13B shows plane B. Tabs 250A through 253A are positioned along the perimeter of plane A. Tabs 251B through 253B are positioned along the perimeter of plane B. The tabs are positioned so that when the planes are overlaid as shown in FIG. 14, the contacts (e.g. contact 255) are interleaved and define a row that is parallel to the perimeter of the planes. Thus, interconnect wires for plane A and interconnect wires for plane B can be routed in parallel to the tabs. This technique reduces the area needed for making contact to the plurality of conductive layers significantly. Interleaving can involve more than 2 planes, such as 8 or 16 planes or more in order to save significantly more area on the device. This technique however involves a non-critical pattern step with each blanket deposition of conductive material.

Figure 15:
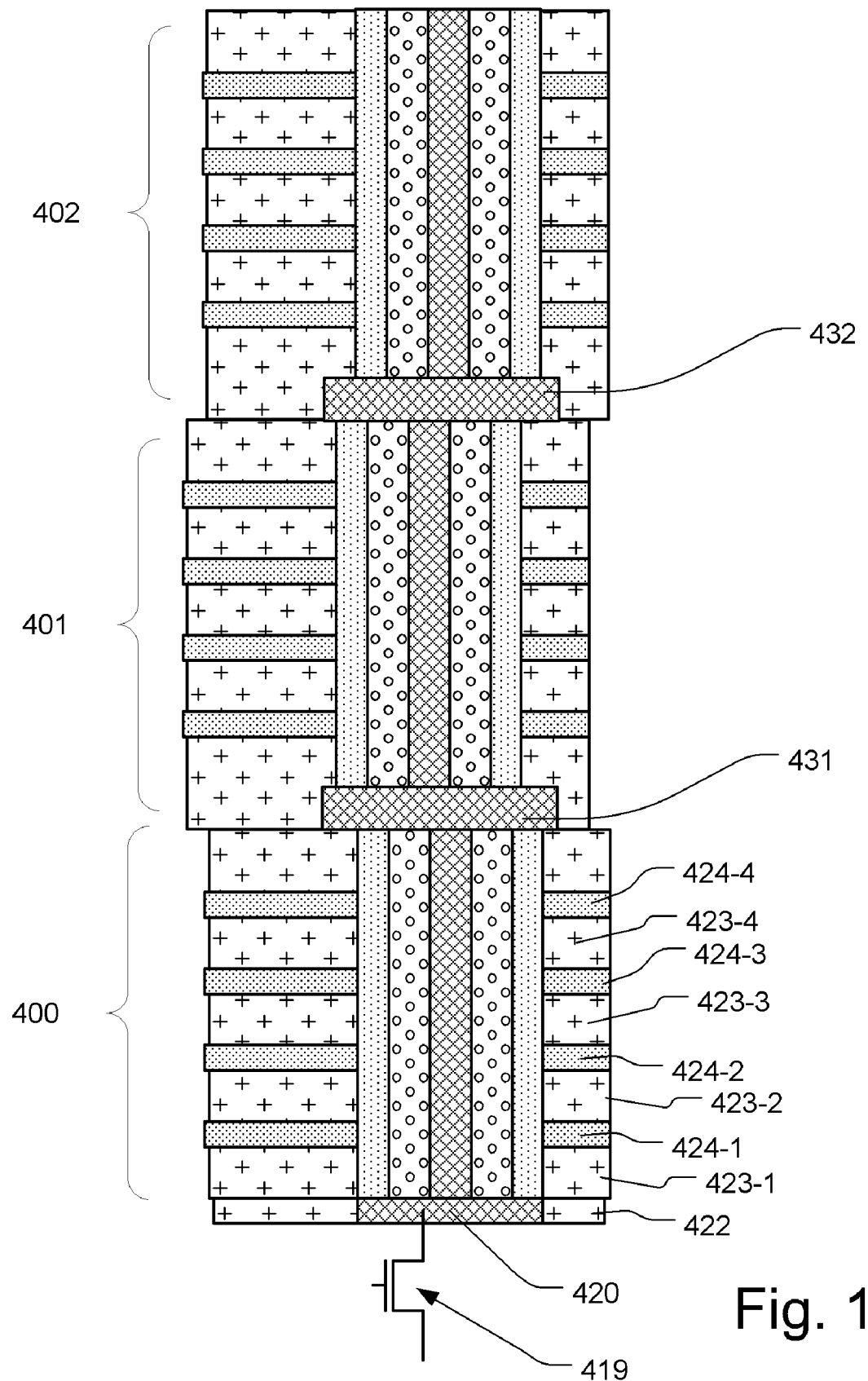
FIG. 15 is a cross-section diagram illustrating an electrode pillar stack adaptable for a very large number of memory planes.

FIG. 15 illustrates one technique for extending the number of conductive layers that can be applied in a single electrode pillar, while maintaining a relatively small via footprint. The structure shown in FIG. 15 includes a stack including a number of sets 400-402 of conductive layers. The first set 400 of conductive layers, is formed by alternating insulator layers 423-1 through 423-4 and conductive layers 424-1 through 424-4 over layer 422. The other sets 401 and 402 comprise similar structures. The process involves first making the first set 400 of conductive layers, defining an electrode pillar via through the first set, and forming the first part of the electrode pillar. The first part of the electrode pillar contacts pad 420 which is coupled to an access device 419. Next, a second set 401 of conductive layers is defined over the first. An electrode pillar via is defined through the second set 401, which opens a via to the first part of the electrode pillar. A second part of the electrode pillar is formed within the via through the second set 401 of conductive layers.

As shown in the drawing, the second part of the electrode pillar may be slightly misaligned with the first, because alignment tolerance is involved in the lithographic processes used to define the vias. Optionally, a contact pad 431 can be formed between the layers by a lithographic step to provide for better alignment tolerance among the lithographic processes if required. Finally, an electrode pillar via is defined through the third set 402 of conductive layers, which opens a via to the second part of the electrode pillar. The third part of the electrode pillar is formed within the third set 402 of conductive layers. The drawing also shows the optional contact pad 432 between the second and third parts of the electrode pillar. Although the drawing shows four conductive layers per set, embodiments of the technology can involve using a larger number of planes, such as 16, 32, 64 or more, contacting each stacked part of the electrode pillar.

Figure 16:
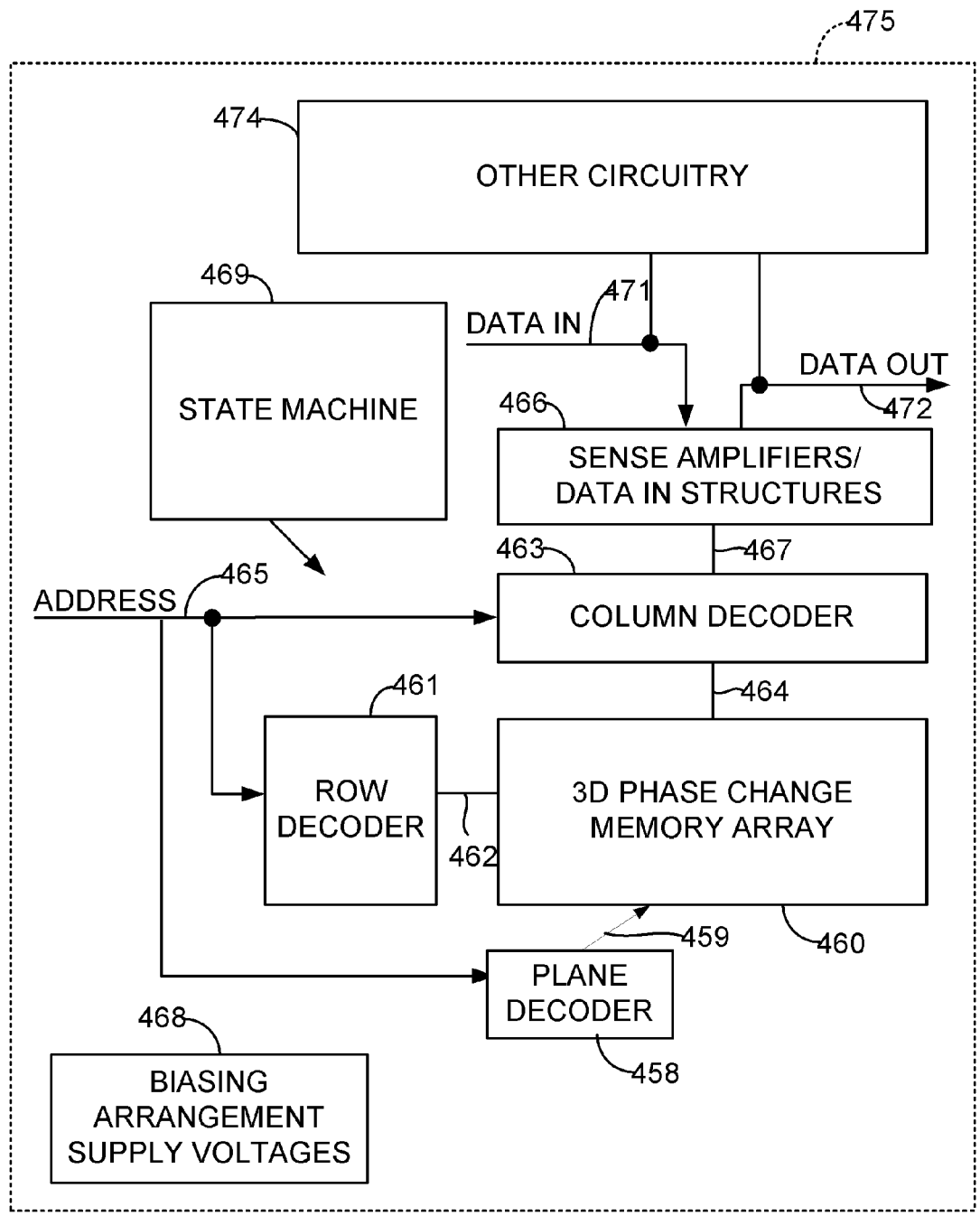
FIG. 16 is a schematic diagram of an integrated circuit including a 3D memory array with row, column and plane decoding circuitry.

FIG. 16 is a simplified block diagram of an integrated circuit according to an embodiment of the present invention. The integrated circuit 475 includes a 3D memory array 460 implemented as described herein, on a semiconductor substrate. A row decoder 461 is coupled to a plurality of word lines 462, and arranged along rows in the memory array 460. A column decoder 463 is coupled to a plurality of bit lines 464 arranged along columns in the memory array 460 for reading and programming data from the memory cells in the array 460. A plane decoder 458 is coupled to a plurality of electrode planes in the memory array 460 on line 459. Addresses are supplied on bus 465 to column decoder 463, row decoder 461 and plane decoder 458. Sense amplifiers and data-in structures in block 466 are coupled to the column decoder 463 in this example via data bus 467. Data is supplied via the data-in line 471 from input/output ports on the integrated circuit 475 or from other data sources internal or external to the integrated circuit 475, to the data-in structures in block 466. In the illustrated embodiment, other circuitry 474 is included on the integrated circuit, such as a general purpose processor or special purpose application circuitry, or a combination of modules providing system-on-a-chip functionality supported by the thin film phase change memory cell array. Data is supplied via the data-out line 472 from the sense amplifiers in block 466 to input/output ports on the integrated circuit 475, or to other data destinations internal or external to the integrated circuit 475.

A controller implemented in this example using bias arrangement state machine 469 controls the application of bias arrangement supply voltage generated or provided through the voltage supply or supplies in block 468, such as read and program voltages. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

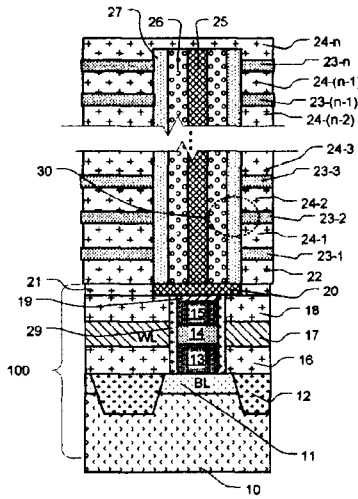

What is claimed is:

1. A memory device, comprising:
an integrated circuit substrate including an array of access devices;
a plurality of conductive layers, separated from each other and from the array of access devices by insulating layers;
an array of electrode pillars extending through the plurality of conductive layers, the electrode pillars in the array contacting corresponding access devices in the array of access devices, and defining interface regions between sides of the electrode pillars and conductive layers in the plurality of conductive layers; and
memory elements in the interface regions, each of said memory elements comprising a programmable phase change memory element and a threshold switch element.

2. A memory device, comprising:
an integrated circuit substrate including an array of access devices;
a plurality of conductive layers, separated from each other and from the array of access devices by insulating layers;
an array of electrode pillars extending through the plurality of conductive layers, the electrode pillars in the array contacting corresponding access devices in the array of access devices, and defining interface regions between the electrode pillars and conductive layers in the plurality of conductive layers;
memory elements in the interface regions, each of said memory elements comprising a programmable phase change memory element and a threshold switch element;
row decoding circuits and column decoding circuits coupled to the array of access devices arranged to select an electrode pillar in the array of electrode pillars; and
plane decoding circuits coupled to the plurality of conductive layers arranged to bias the threshold switching elements to a conductive state in the interface regions in a selected conductive layer and to bias the threshold switching elements to a non-conductive state in interface regions in a non-selected conductive layer.

3. The memory device of claim 1, wherein an electrode pillar in the array of electrode pillars comprises a conductor in electrical communication with a corresponding access device, and a layer of phase change memory material between the conductor and the plurality of conductive layers, wherein the programmable phase change element in each of said memory elements comprises an active region in the layer of phase change memory material at the interface regions.

4. The memory device of claim 1, wherein an access device in the array of access devices comprises:
 a transistor having a gate, a first terminal and a second terminal; and
 the array including a bit line coupled to the first terminal, a word line coupled to the gate, and wherein the second terminal is coupled to a corresponding electrode pillar in the array of electrode pillars.

5. The memory device of claim 1, wherein an access device in the array of access devices comprises a vertical transistor.

6. The memory device of claim 1, wherein the plurality of conductive layers have perimeters, and respective portions of said perimeters are configured for contact to decoding circuitry.

7. The memory device of claim 1, wherein the plurality of conductive layers have perimeters, and respective portions of said perimeters include tabs configured for contact to decoding circuitry, and including
 a wiring layer overlying said plurality of conductive layers including conductors coupling said plurality of conductive layers to decoding circuitry; and
 conductive plugs contacting said tabs and extending upwardly to the wiring layer.

8. The memory device of claim 7, wherein said tabs are arranged in an interleaved fashion, so that conductive plugs in the plurality of conductive plugs that are coupled to interleaved tabs on different conductive layers in the plurality of conductive layers are arranged in a row, the row extending in a direction defined by the interleaved tabs.

9. The memory device of claim 1, wherein the array of access devices underlies the plurality of conductive layers.

10. The memory device of claim 1, wherein an electrode pillar in the array of electrode pillars comprises a central core conductor in electrical communication with a corresponding access device, and a layer of phase change memory material on the central core conductor, a layer of threshold switching material over the layer of phase change memory material and contacting the plurality of conductive layers, wherein each of said phase change memory elements comprises an active region in the layer of phase change memory material at the interface regions between the central core conductor and the layer of threshold switching material.

11. The memory device of claim 1, wherein the electrode pillars comprise respective stacks of electrode portions, where each portion extends through a corresponding set of the plurality of conductive layers.

12. A memory device, comprising:
 an integrated circuit substrate including an array of electrode pillars and a plurality of electrode planes that intersect the electrode pillars at interface regions;
 phase change memory elements in the interface regions comprising programmable elements and threshold switching elements;
 row decoding circuits and column decoding circuits arranged to select electrode pillars in the array of electrode pillars; and
 plane decoding circuits arranged to bias the threshold switching elements in a conductive state in the interface regions in a selected electrode plane and to bias the threshold switching elements in a non-conductive state in interface regions in a non-selected electrode plane.

* * * * *

UNITED STATES PATENT AND TRADEMARK OFFICE
CERTIFICATE OF CORRECTION

PATENT NO. : 8,173,987 B2
APPLICATION NO. : 12/430386
DATED : May 8, 2012
INVENTOR(S) : Hsiang-Lan Lung It is certified that error appears in the above-identified patent and that said Letters Patent is hereby corrected as shown below:

In column 16, after line 34, insert the following claims:

--13. A method for manufacturing a memory device, comprising:
  forming an array of access devices;
  forming a plurality of conductive layers under or over the array of access devices, separated from each other and from the array of access devices by insulating layers;
  forming an array of electrode pillars extending through the plurality of conductive layers, the electrode pillars in the array contacting corresponding access devices in the array of access devices, and defining interface regions between sides of the electrode pillars and conductive layers in the plurality of conductive layers; and
  forming memory elements in the interface regions, each of said memory elements comprising a programmable phase change memory element and a threshold switch element.

14. The method of claim 13, wherein said forming a plurality of conductive layers includes blanket deposition of conductor material.

15. The method of claim 14, wherein said forming a plurality of conductive layers includes:
  forming a plurality of blanket layers of conductor material; and
  forming blanket layers of insulating material between the blanket layers of conductor material.

16. The method of claim 13, wherein said forming an array of electrode pillars includes:
  defining an electrode via through the plurality of conductive layers;
  depositing a layer of threshold switching material and a layer of memory material on sidewalls of the electrode via; and
  filling the electrode via over the layer of memory material with an electrode material.

17. The method of claim 13, wherein said phase change memory material comprises a chalcogenide.

Signed and Sealed this
Tenth Day of July, 2012

David J. Kappos
*Director of the United States Patent and Trademark Office*

18. The method of claim 13, wherein said forming an array of electrode pillars includes:
   defining an electrode via within the plurality of conductive layers;
   depositing a layer of threshold switching material on sidewalls of the electrode via;
   forming a layer of phase change memory material on the layer of threshold switching material; and
   filling the electrode via over the layer of phase change material with an electrode material.

19. The method of claim 18, wherein said filling the electrode via over the layer of phase change material includes forming a thin film of electrode material over the layer phase change material, anisotropically etching to form an opening in the electrode via exposing a contact for the corresponding access device, and filling the via and the resulting opening with electrode material.--

UNITED STATES PATENT AND TRADEMARK OFFICE
CERTIFICATE OF CORRECTION

| | |
|---|---|
| PATENT NO. | : 8,173,987 B2 |
| APPLICATION NO. | : 12/430386 |
| DATED | : May 8, 2012 |
| INVENTOR(S) | : Hsiang-Lan Lung |

It is certified that error appears in the above-identified patent and that said Letters Patent is hereby corrected as shown below:

Delete title page and substitute therefor the attached title page showing the corrected number of claims in patent.

In column 16, after line 34, insert the following claims:

--13. A method for manufacturing a memory device, comprising:
   forming an array of access devices;
   forming a plurality of conductive layers under or over the array of access devices, separated from each other and from the array of access devices by insulating layers;
   forming an array of electrode pillars extending through the plurality of conductive layers, the electrode pillars in the array contacting corresponding access devices in the array of access devices, and defining interface regions between sides of the electrode pillars and conductive layers in the plurality of conductive layers; and
   forming memory elements in the interface regions, each of said memory elements comprising a programmable phase change memory element and a threshold switch element.

14. The method of claim 13, wherein said forming a plurality of conductive layers includes blanket deposition of conductor material.

15. The method of claim 14, wherein said forming a plurality of conductive layers includes:
   forming a plurality of blanket layers of conductor material; and
   forming blanket layers of insulating material between the blanket layers of conductor material.

This certificate supersedes the Certificate of Correction issued July 10, 2012.

Signed and Sealed this
Fourteenth Day of August, 2012

David J. Kappos
*Director of the United States Patent and Trademark Office*

16. The method of claim 13, wherein said forming an array of electrode pillars includes:
   defining an electrode via through the plurality of conductive layers;
   depositing a layer of threshold switching material and a layer of memory material on sidewalls of the electrode via; and
   filling the electrode via over the layer of memory material with an electrode material.

17. The method of claim 13, wherein said phase change memory material comprises a chalcogenide.

18. The method of claim 13, wherein said forming an array of electrode pillars includes:
   defining an electrode via within the plurality of conductive layers;
   depositing a layer of threshold switching material on sidewalls of the electrode via;
   forming a layer of phase change memory material on the layer of threshold switching material; and
   filling the electrode via over the layer of phase change material with an electrode material.

19. The method of claim 18, wherein said filling the electrode via over the layer of phase change material includes forming a thin film of electrode material over the layer phase change material, anisotropically etching to form an opening in the electrode via exposing a contact for the corresponding access device, and filling the via and the resulting opening with electrode material.--

CERTIFICATE OF CORRECTION (continued)

(12) United States Patent
Lung

(10) Patent No.: US 8,173,987 B2
(45) Date of Patent: May 8, 2012

(54) INTEGRATED CIRCUIT 3D PHASE CHANGE MEMORY ARRAY AND MANUFACTURING METHOD

(75) Inventor: Hsiang-Lan Lung, Elmsford, NY (US)

(73) Assignee: Macronix International Co., Ltd., Hsinchu (TW)

( * ) Notice: Subject to any disclaimer, the term of this patent is extended or adjusted under 35 U.S.C. 154(b) by 53 days.

(21) Appl. No.: 12/430,386

(22) Filed: Apr. 27, 2009

(65) Prior Publication Data
US 2010/0270529 A1     Oct. 28, 2010

(51) Int. Cl.
*H01L 29/02* (2006.01)

(52) U.S. Cl. .. 257/2; 257/3; 257/4; 257/5; 257/E29.002; 438/102; 438/103

(58) Field of Classification Search ............... 257/1–5, 257/E29.002; 438/102–103; 365/163
See application file for complete search history.

(56) References Cited

U.S. PATENT DOCUMENTS

| | | |
|---|---|---|
| 3,271,591 A | 9/1966 | Ovshinsky |
| 3,530,441 A | 9/1970 | Ovshinsky |
| 4,452,592 A | 6/1984 | Tsai |
| 4,599,705 A | 7/1986 | Holmberg et al. |
| 4,719,594 A | 1/1988 | Young et al. |
| 4,769,339 A | 9/1988 | Ishii |
| 4,876,220 A | 10/1989 | Mohsen et al. |
| 4,959,812 A | 9/1990 | Momodomi et al. |
| 5,106,775 A | 4/1992 | Kaga et al. |
| 5,166,096 A | 11/1992 | Cote et al. |
| 5,166,758 A | 11/1992 | Ovshinsky et al. |
| 5,177,567 A | 1/1993 | Klersy et al. |
| 5,332,923 A | 7/1994 | Takeuchi et al. |
| 5,391,901 A | 2/1995 | Tanabe et al. |
| 5,515,488 A | 5/1996 | Hoppe et al. |
| 5,534,712 A | 7/1996 | Ovshinsky et al. |
| 5,550,396 A | 8/1996 | Tsutsumi et al. |
| 5,687,112 A | 11/1997 | Ovshinsky |
| 5,688,713 A | 11/1997 | Linliu et al. |
| 5,716,883 A | 2/1998 | Tseng et al. |
| 5,754,472 A | 5/1998 | Sim et al. |
| 5,789,277 A | 8/1998 | Zahorik et al. |
| 5,789,758 A | 8/1998 | Reinberg |
| 5,814,527 A | 9/1998 | Wolstenholme et al. |
| 5,831,276 A | 11/1998 | Gonzalez et al. |

(Continued)

FOREIGN PATENT DOCUMENTS

EP   1936681 A1   6/2008

(Continued)

OTHER PUBLICATIONS

"Magnetic Bit Boost," www.sciencenews.org, Dec. 18 & 25, 2004, p. 389, vol. 166.

(Continued)

*Primary Examiner* — Jami M Valentine
(74) *Attorney, Agent, or Firm* — Haynes Beffel & Wolfeld LLP

(57) ABSTRACT

A 3D phase change memory device is based on an array of electrode pillars and a plurality of electrode planes that intersect the electrode pillars at interface regions that include memory elements that comprise a programmable phase change memory element and a threshold switching element. The electrode pillars can be selected using two-dimensional decoding, and the plurality of electrode planes can be selected using decoding on a third dimension.

19 Claims, 13 Drawing Sheets